(12) United States Patent
Ebinuma et al.

(10) Patent No.: US 6,396,566 B2
(45) Date of Patent: *May 28, 2002

(54) STAGE SYSTEM FOR EXPOSURE APPARATUS AND DEVICE MANUFACTURING METHOD IN WHICH A STAGE SUPPORTING MEMBER AND A COUNTERMASS SUPPORTING MEMBER PROVIDE VIBRATION ISOLATION

(75) Inventors: Ryuichi Ebinuma, Tokyo; Makoto Mizuno, Utsunomiya, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/219,601

(22) Filed: Dec. 23, 1998

(30) Foreign Application Priority Data

Dec. 26, 1997 (JP) ............................................. 9-359805

(51) Int. Cl.[7] ......................... G03B 27/42; G03B 27/58; G03B 27/62
(52) U.S. Cl. ............................... 355/53; 355/72; 355/75
(58) Field of Search ............................... 355/53, 72, 75; 350/399, 400, 401; 310/12; 318/687, 560

(56) References Cited

U.S. PATENT DOCUMENTS

| 5,172,160 | A |   | 12/1992 | Van Eijk et al. ............... 355/53 |
| 5,933,215 | A | * | 8/1999  | Inoue et al. ................... 355/53 |
| 5,959,427 | A | * | 9/1999  | Watson ........................ 318/687 |
| 6,028,376 | A | * | 2/2000  | Osanai et al. ................. 310/12 |

FOREIGN PATENT DOCUMENTS

| JP | 3-21894   | 1/1991 |
| JP | 3-107639  | 5/1991 |
| JP | 6-163353  | 6/1994 |
| JP | 9-4677    | 1/1997 |

\* cited by examiner

*Primary Examiner*—Russell Adams
*Assistant Examiner*—Peter B. Kim
(74) *Attorney, Agent, or Firm*—Fitzpatrick, Cella, Harper & Scinto

(57) ABSTRACT

A stage system includes a stage mechanism having a movable stage and a stage supporting member for carrying the movable stage thereon, and a countermass mechanism having a movable countermass and a countermass supporting member for carrying the countermass thereon, wherein the stage supporting member and the countermass supporting member are supported separately or with vibration isolated.

49 Claims, 23 Drawing Sheets

STAGE SYSTEM FOR EXPOSURE APPARATUS AND DEVICE MANUFACTURING METHOD IN WHICH A STAGE SUPPORTING MEMBER AND A COUNTERMASS SUPPORTING MEMBER PROVIDE VIBRATION ISOLATION

FIELD OF THE INVENTION AND RELATED ART

This invention relates generally to a stage system for carrying a workpiece thereon and for positioning the same. More particularly, the invention is concerned with a stage system for carrying thereon a reticle, for example, and for performing precise positioning of the same. In other aspects, the invention is concerned with an exposure apparatus or a scanning exposure apparatus using such a stage system, and a device manufacturing method for manufacturing devices by use of such an exposure apparatus.

FIG. 25 is a schematic view of a conventional exposure apparatus.

There is a bottom table 61 placed on the floor surface, on which a barrel base 71 is supported through an anti-vibration mechanism 62. Denoted at 70 is a base mounted on the bottom table. There is a wafer stage 69 which is supported by the base for movement in two-dimensional directions (X and Y directions). The barrel base 71 is provided with a projection optical system and a reticle stage 68 for moving a reticle (original). Disposed above is an illumination system for supplying exposure light.

In the structure described above, the wafer stage 69 operates so that, for a wafer supplied by a wafer conveying system (not shown), a target position with respect to the reticle is transferred through an alignment system to interferometer data and, while using the interferometer data as a target, an X-Y moving mechanism (not shown) moves the wafer stage 69 to a predetermined position where an image of the reticle is printed. Then, the wafer stage is moved to a next position. This operation is repeated, and images of the reticle are printed on the whole surface of one wafer.

For enlargement of the productivity of an exposure apparatus, stage movement time and/or exposure time has to be reduced. For reduced stage movement time, the acceleration or deceleration speed during movement should be increased. On the other hand, for enlargement of productivity in the post-processing procedure, the wafer diameter should be large and, in this connection, the mass of a wafer chuck or wafer stage has to be enlarged.

A stage driving mechanism should provide a thrust corresponding to the product of the mass of a stage and the acceleration thereof, and the thrust to be produced by the driving mechanism must be very large due to a multiplied effect of the wafer size and acceleration. As a result of this, when the stage is driven, a large reactive force is produced which causes deformation in the major assembly of the exposure apparatus, leading to deterioration of positioning precision in lithographic transfer or distortion of a transferred pattern. A reactive force receiving mechanism for applying a force to the base from outside the stage system may be effective to this problem.

FIG. 26 shows an example of such a reactive force receiving mechanism, provided in the apparatus of FIG. 25.

Denoted in FIG. 26 at 68 is a reticle stage, and denoted at 71 is a barrel base for supporting the reticle stage. Denoted at 62 is an anti-vibration spring for supporting the base and for reducing vibration from the floor surface. Denoted at 61 is a bottom plate fixedly mounted on the floor surface. Denoted at 75 is a reactive force receiving member. A stator 77 fixed to the barrel base 71 and a movable element 78 provided on the reactive force receiving member 75 are components of an actuator 76, for producing the thrust.

FIG. 27 illustrates forces produced in the mechanism of FIG. 26.

In the structure of FIG. 27, when the actuator 76 is inoperative, as the stage 69 of a mass m moves with an acceleration $a$, a reactive force ma is applied to the barrel base 71. This reactive force ma causes deformation of the major assembly and, also, displacement of the anti-vibration spring 62, causing vibration of the bottom plate 61. In order to prevent this deformation of barrel base 71 or vibration, a force f is applied by the actuator 76 and from the reactive force receiving member 75, disposed independently of the barrel base, to cancer the reactive force ma.

In a stage system having such a reactive force receiving mechanism, however, transmission of a reactive force to the floor is inevitable. As shown in FIG. 27, to the floor surface, a load ma along the surface as well as a moment force M=Lma are applied. Here, L is the distance from the gravity center position of the movement stage to the floor surface.

Generally, the floor has a large rigidity to the load along the surface, but the rigidity to a load perpendicular to the floor surface or to the moment load is small. Therefore, due to the moment force M=Lma, floor vibration is produced. This vibration applies an adverse effect on the apparatus itself or to any other components mounted on the same floor surface.

SUMMARY OF THE INVENTION

It is an object of the present invention to provide a stage system by which vibration to be produced by stage movement can be suppressed, by which floor vibration can be avoided or reduced.

In accordance with an aspect of the present invention, there is provided a stage system, comprising: a stage mechanism having a movable stage and a stage supporting member for carrying said movable stage thereon; and a countermass mechanism having a movable countermass and a countermass supporting member for carrying said countermass thereon; wherein said stage supporting member and said countermass supporting member are supported separately. Said stage supporting member and said countermass supporting member may be arranged with vibration isolated. The stage system may further comprise a stage driving mechanism for moving said movable stage, and a countermass driving mechanism for moving said countermass. Said countermass driving mechanism may move said countermass to reduce a drive reactive force produced with movement of said movable stage. At least one of said driving mechanisms may comprise one of a linear motor and a ball screw. At least a portion of said countermass driving mechanism may be fixed to said countermass and is movable with said countermass. Said stage driving mechanism may include a stator supported by said stage supporting member and a movable element provided on said movable stage, and one of a base for supporting said stage mechanism, said stage supporting member and said stator may be connected to said countermass mechanism. Said stator may be fixed to said stage supporting member. Said stator of said stage driving mechanism may be supported with freedom in a direction parallel to the stage movement direction.

Said stator of said stage driving mechanism may be supported by use of one of a spring, a static pressure bearing and a roll bearing. Said countermass mechanism may be controlled on the basis of a signal for controlling said stage mechanism. The stage system may further comprise measuring means for measuring a position of said movable stage. Said countermass may be controlled on the basis of an output of said measuring means. The stage system may further comprise a connecting mechanism for transmitting a drive reactive force, produced with movement of said movable stage, to said countermass mechanism. Said connecting mechanism may include a rotary joint being rotatable. Said connecting mechanism may include a thrust producing mechanism for producing a thrust. Said connecting mechanism may comprise an electromagnetic joint for producing an electromagnetic force. Said electromagnetic joint may include a coil and a magnet for producing a thrust, wherein one of said coil and said magnet may be provided on the stage mechanism side while the other may be provided on the countermass mechanism side. The stage system may further comprise a stage driving mechanism for moving said movable stage, wherein said countermass may be driven by a drive reactive force produced with movement of said movable stage. Said stage driving mechanism may comprise a linear motor having a magnet and a coil wherein one of said magnet and said coil may be provided on the stage mechanism side while the other may be provided on the countermass mechanism side. The stage system may further comprise a moving mechanism for correcting a positional deviation of said countermass. A gravity center of said countermass may be placed substantially on an extension line of a movement direction of said movable stage. Said stage supporting member may be supported through a mounting mechanism.

In accordance with another aspect of the present invention, there is provided a stage system, comprising: a stage mechanism having a movable stage and a stage supporting member for carrying said movable stage thereon; a countermass mechanism having a movable countermass and a countermass supporting member for carrying said countermass thereon; and a connecting mechanism for transmitting a drive reactive force produced with movement of said movable stage to said countermass. Said connecting mechanism may include a rotary joint being rotatable. Said connecting mechanism may include a thrust producing mechanism for producing a thrust. Said connecting mechanism may comprise an electromagnetic joint for producing an electromagnetic force. Said electromagnetic Joint may include a coil and a magnet for producing a thrust, wherein one of said coil and said magnet may be provided on the stage mechanism side while the other may be provided on the countermass mechanism side. The stage system may further comprise a stage driving mechanism for moving said movable stage, and a countermass driving mechanism for moving said countermass. Said countermass driving mechanism may move said countermass to reduce a drive reactive force produced with movement of said movable stage. Said driving mechanism may include one of a linear motor and a ball screw. The stage system may further comprise a stage driving mechanism for moving said movable stage, wherein said countermass may be driven by a reactive force produced with movement of said movable stage. Said stage driving mechanism may comprise a linear motor having a magnet and a coil, and wherein one of said magnet and said coil may be provided on the stage mechanism side while the other may be provided on the countermass mechanism side. The stage system may further comprise a moving mechanism for correcting a positional deviation of said countermass. A gravity center of said countermass may be placed substantially on an extension line of a movement direction of said movable stage. Said stage supporting member may be supported through a mounting mechanism.

In accordance with a further aspect of the present invention, there is provided an exposure apparatus, comprising: an illumination optical system for providing illumination light; and a stage system for carrying one of a reticle and a wafer thereon, wherein said stage system includes (i) a stage mechanism having a movable stage and a stage supporting member for carrying said movable stage thereon, and (ii) a countermass mechanism having a movable countermass and a countermass supporting member for carrying said countermass thereon, wherein said stage supporting member and said countermass supporting member are arranged with vibration isolated.

In accordance with a yet further aspect of the present invention, there is provided an exposure apparatus, comprising: an illumination optical system for providing illumination light; and a stage system for carrying one of a reticle and a wafer thereon, wherein said stage system includes (i) a stage mechanism having a movable stage and a stage supporting member for carrying said movable stage thereon, (ii) a countermass mechanism having a movable countermass and a countermass supporting member for carrying said countermass thereon, and (iii) a connecting mechanism for transmitting a drive reactive force produced with movement of said movable stage to said countermass mechanism.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
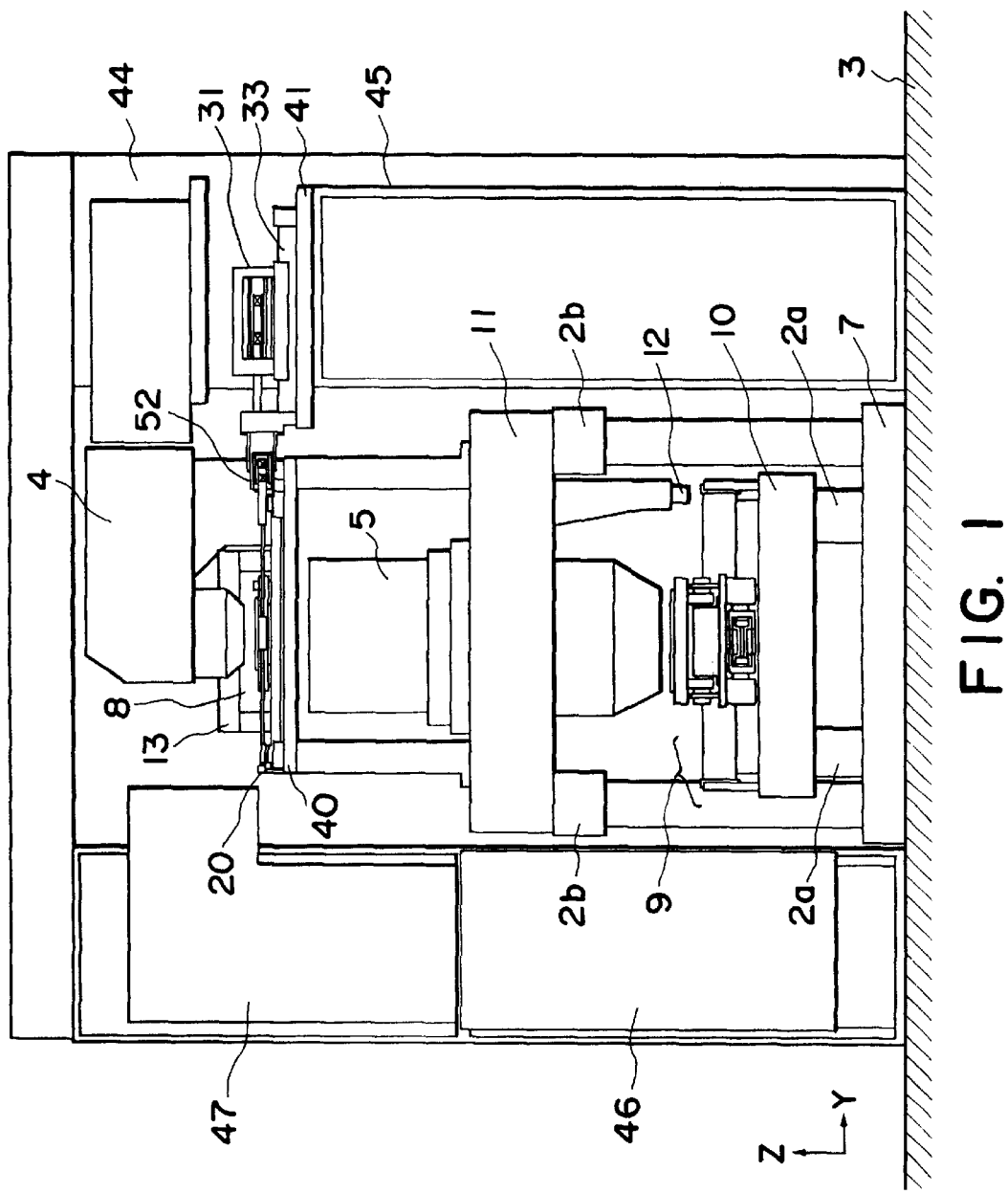
FIG. 1 is a schematic view of an exposure apparatus according to a first embodiment of the present invention.

FIG. 1 is a schematic view of an exposure apparatus according to a first embodiment of the present invention.

Illumination optical system 4 projects exposure illumination light to a portion of a reticle which is placed on a reticle stage 8. The illumination region has a slit-like shape and it covers a portion of a pattern region upon the reticle. The pattern corresponding to this slit portion is projected on a wafer, placed on a wafer stage 9, through a projection optical system 5 while being reduced at a ratio 1/4.

Denoted at 3 is a floor or a base member on which the exposure apparatus is mounted. On the floor 3, there are a base frame 7 for supporting an optical system and a stage system of the exposure apparatus, and a mechanical chamber 44 for maintaining the environment of the exposure apparatus at a predetermined temperature and predetermined cleanness. These members are disposed on the floor separately, i.e., independently of each other.

Denoted at 46 is a wafer conveying system for loading a wafer into the exposure apparatus. Denoted at 47 is a reticle conveying system for loading a reticle into the exposure apparatus.

On the base frame 7, there are a barrel base 11 for supporting the projection optical system 5, a reticle stage system, and a stage position measuring system, for example, as well as a wafer stage. These mechanisms are mounted on the base frame through separate mounting mechanisms.

Denoted at 10 is a wafer stage base which is mounted on the base frame through mounting means 2a. The mounting means 2a comprises an active damper having an air spring and an electromagnetic actuator, for isolating vibration from the floor 3 and also for performing vibration control so that the attitude of the wafer stage 9 does not change beyond a predetermined range. The wafer stage 9 is mounted on the wafer stage base. The wafer stage 9 having a wafer mounted thereon can be moved in X and Y directions along the wafer stage base. Further, the wafer stage 9 can be moved by a minute amount in the Z direction and around X, Y and Z axes. In such movement, the stage position is measured. The barrel base is provided with references for the position measurement with respect to these directions. Denoted at 12 is an interferometer for measuring the wafer stage position.

The wafer stage 9 is moved in the X and Y directions by an electromagnetic linear motor (not shown) of a non-contact type which is known in the art.

The reticle stage 8 is mounted on a reticle stage supporting member 40 upon the barrel base 11, mounted on a barrel base mount 2b. Denoted at 13 is an alignment measuring system. This mount has an anti-vibration function for preventing transmission of vibration to the barrel base from the floor, for example, as well as a vibration control function for maintaining the barrel base at a predetermined attitude precision.

Disposed on the reticle stage is a reticle having a pattern to be transferred.

Figure 2:
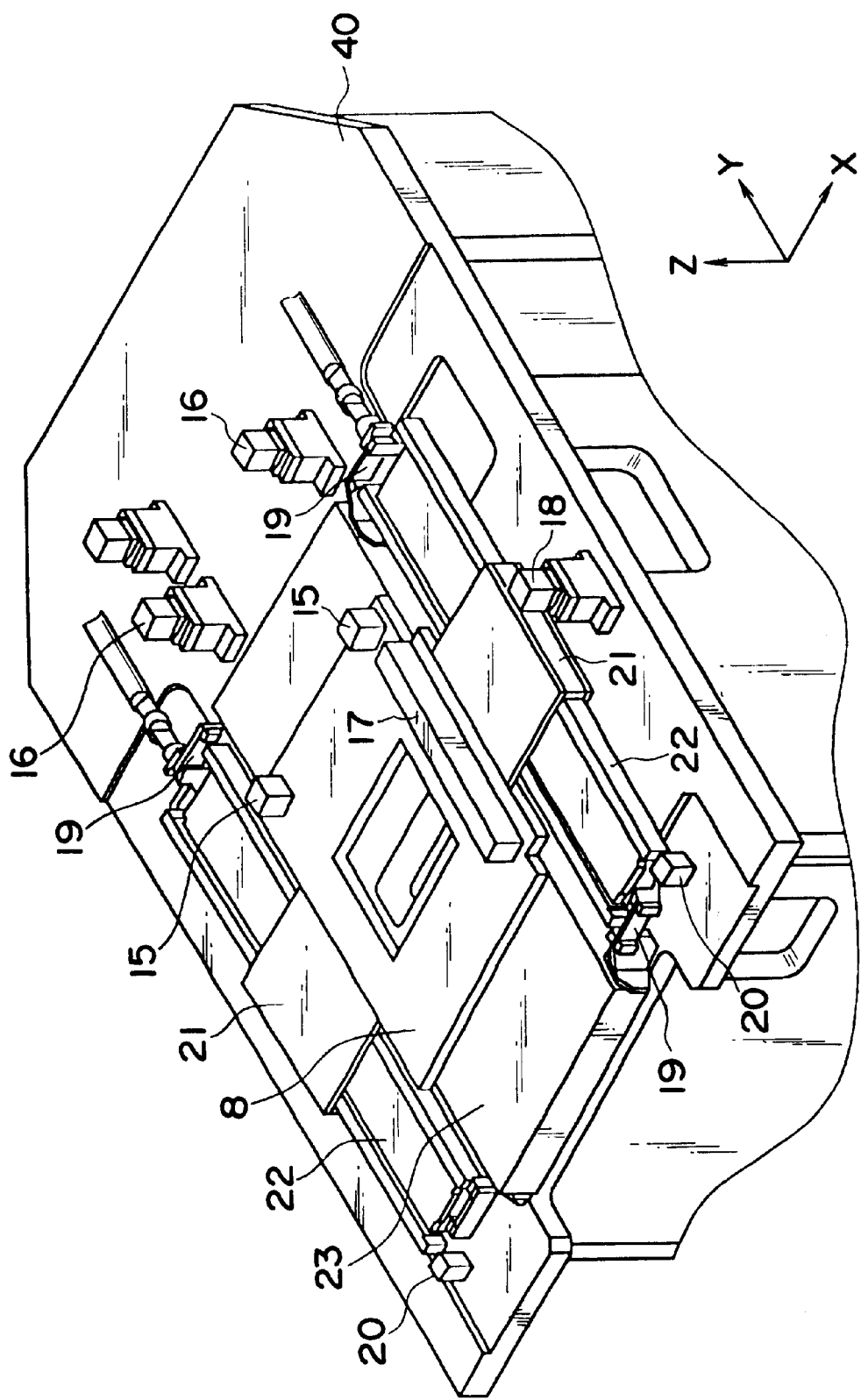
FIG. 2 is a fragmentary view of a reticle stage in the first embodiment of the present invention.

FIG. 2 is a schematic view of the reticle stage, constituting a stage mechanism.

In FIG. 2, a reticle (not shown) is placed on the reticle stage. Disposed below the reticle stage 8 are pads of air bearing means (not shown). The reticle stage is guided by a guide 23, for movement in the Y direction. Denoted at 15 is a corner cube which serves as a reflection member for a measuring device, for measuring the position of the reticle stage. Denoted at 16 is an interferometer. By means of these two measuring devices, the position of the reticle stage with respect to the scan direction as well as the attitude thereof with respect to a rotational direction (θ) around the exposure optical axis, i.e., yawing, are measured. Denoted at 17 is a mirror which serves as a reflection member for performing measurement in a perpendicular direction, along the reticle pattern surface, relative to the scan direction of the reticle stage. Denoted at 18 is an interferometer corresponding to this mirror. Denoted at 21 are movable elements (first movable elements) of a driving mechanism fixed to the reticle stage 8. These movable elements are disposed at the opposite ends of the reticle stage. Denoted at 22 are stators (first stators) of the driving mechanism, which are disposed in association with the movable element unit 21. Each stator 22 is supported at its opposite ends by the stage supporting member 40, mounted on the barrel base, through a leaf spring 19. This leaf spring 19 functions to reduce transmission of a reactive force, to the barrel base 11, applied to the stator unit 22 as a thrust is applied to the reticle stage 8. The leaf spring 19 may be replaced by a straight motion roll bearing or air bearing means, for example. Denoted at 20 is a non-contact type distance measuring sensor. This sensor serves to detect the distance between the stator 22 and the barrel base or the stage supporting member 40. The direction of detection lies in the thrust producing direction of the linear motor, and it is a Y direction in the drawing.

Figure 3:
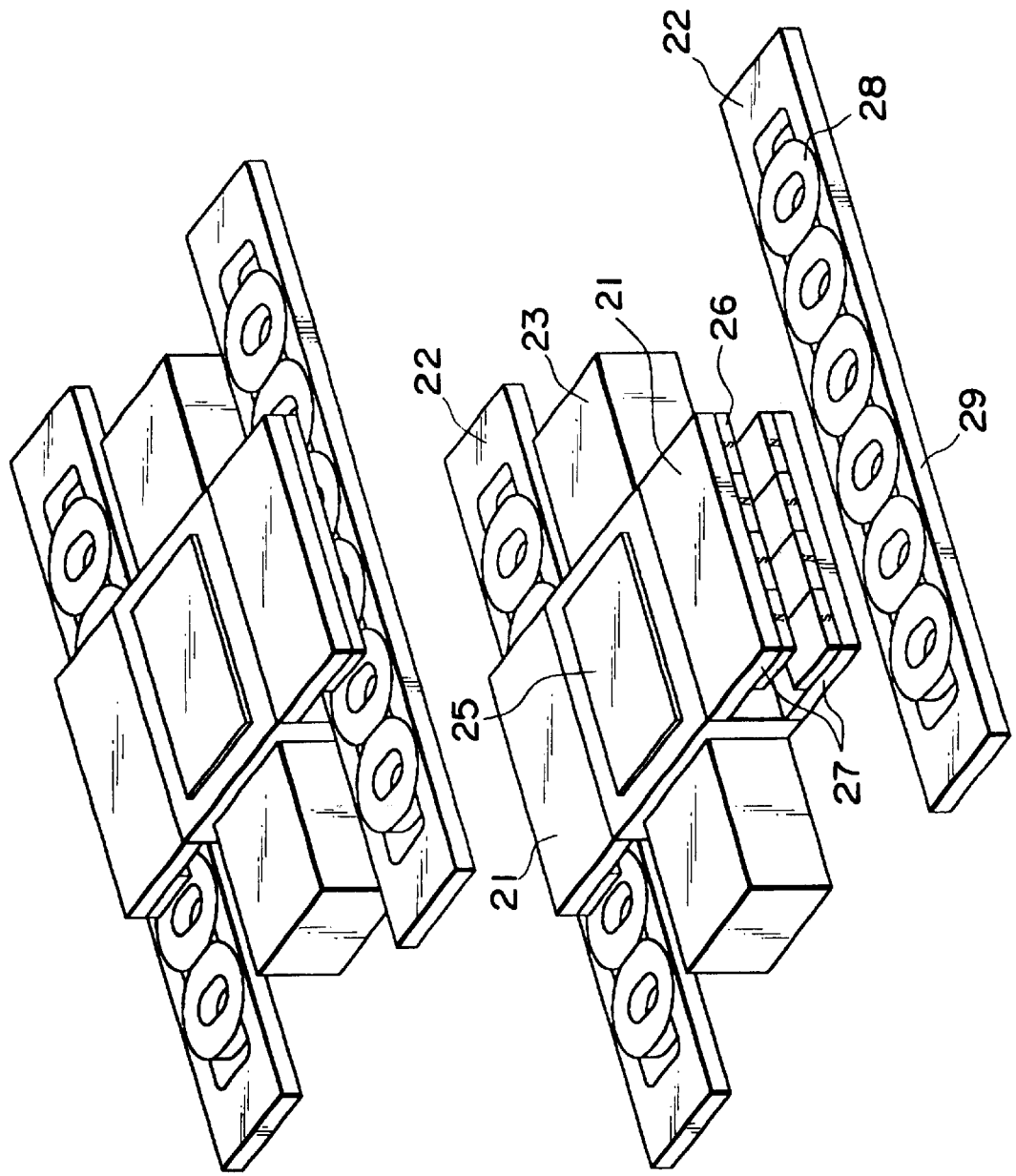
FIG. 3 is a schematic view for explaining linear motors used in the reticle stage of the first embodiment.

FIG. 3 is a schematic view of the driving mechanism for the reticle stage 8. The driving mechanism as illustrated comprises a non-contact type electromagnetic linear motor. There are movable elements 21 disposed at the opposite sides of the stage movable portion on which a workpiece 25 such as a reticle, for example, is mounted. The stage 8 is guided by a guide 23. Each movable element 21 comprises plural magnets 26 and yokes 27, and it faces to the linear motor stator 22 without contact thereto. The stator 22 comprises plural coils 28 disposed along the movement direction as well as a stator frame 29 for supporting the coils.

In response to application of an electric current to the coils 28, a thrust to the movable element 21 is produced. As the movable element 21 moves, coils 28 to be energized are changed sequentially, by which a necessary movement stroke is provided. The linear motor stator shown in the drawing has a liquid cooling jacket with which the coil array is covered.

Figure 4:
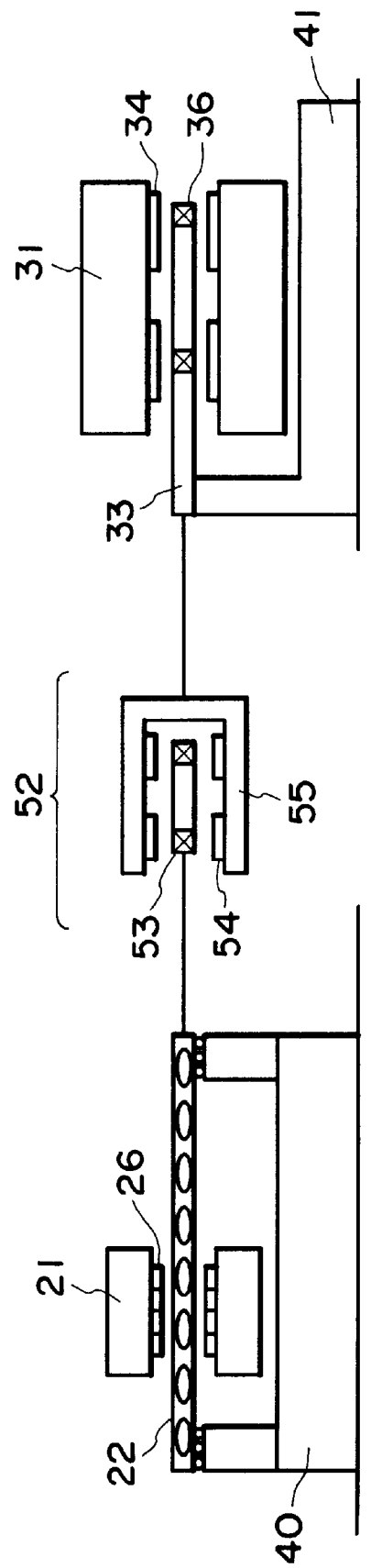
FIG. 4 is a schematic view of a model for the stage system in the first embodiment of the present invention.

Important features of the present invention will be described in conjunction with FIG. 4. FIG. 4 is a schematic view of a model of a stage system according to the present invention.

Denoted at 22 is a linear motor stator having plural coils 28 and a stator frame 29 for supporting the coils. Denoted at 21 is a linear motor movable element having magnets 26 disposed opposed to the coils 28 of the stator. The linear motor movable element 21 is provided on the reticle stage which carries a reticle thereon.

Denoted at 40 is a stage supporting member for supporting the linear motor stator 22. The linear motor stator 22 is supported on the supporting member, freely with respect to the stage movement direction. The stage supporting member 40 is fixed to the barrel base 11.

Denoted at 31 is a countermass which is provided on a mechanism disposed separately and independently of the reticle stage, such as a machine chamber frame 45, for example.

The countermass 31 has magnets 34 and an iron core, as a movable element (second movable element) of an actuator. The countermass can be driven by a countermass driving linear motor stator 33 (second stator) which is supported by a separate and has coils 36. Denoted at 41 is a countermass supporting member for supporting the linear motor stator 33 for driving the countermass. This countermass supporting member 41 is made independent, with respect to vibration, from the reticle stage and the barrel base, for example, by means of a mounting mechanism 2b, if connecting means to be described later is not taken into consideration. The linear motor stator 33 at the countermass side (countermass mechanism) is supported freely with respect to the movement direction, similarly to the reticle stage side stator 22. However, the stator 33 and the countermass supporting member 41 may be fixedly supported. Further, while not shown in the drawing, the countermass is provided with an optical linear encoder as position measuring means. The components described above constitute the countermass mechanism.

An electromagnetic joint 52 (connecting means) used in this embodiment is illustrated in FIG. 4. A combination of coil 53 and magnet 54 on yoke 55 constitutes an actuator (thrust producing means) for producing a thrust, and a non-contact electromagnetic joint 52 is provided. In order that transmission through this electromagnetic joint 52 is accomplished, a thrust corresponding to a force to be transmitted is produced by which transmission is accomplished. The electromagnetic joint 52 can produce a thrust in a lateral direction, as viewed in the drawing.

The reticle stage 8 moves during the exposure operation and, therefore, upon acceleration and deceleration a reactive force is produced at the linear motor stator 22 which is the driving mechanism for the reticle stage 8. Since, in this embodiment, the stator 22 is supported freely with respect to the reticle stage movement direction, the produced reactive force is transmitted to the countermass driving linear motor stator 33 through the electromagnetic joint 52.

On the other hand, when the countermass 31 is actuated, similarly, a reactive force is produced from the stator 33. By this reactive force, the above-described reactive force from the reticle stage is reduced. If the mass of the reticle stage 8 is M, the acceleration is A and the mass of the countermass is m, then for reduction of the reactive force; the acceleration a of the countermass 31 should satisfy the relation:

$$a = A \times M/m$$

If the mass M of the reticle stage 8 or the acceleration A is of a determined value, the acceleration a can be reduced more with a larger mass m of the countermass 31, and the movable range (stroke) of the countermass 31 can be made smaller. Further, by reducing the stroke, it is possible to reduce the influence due to the movement load of a table that supports the countermass.

Figure 5:
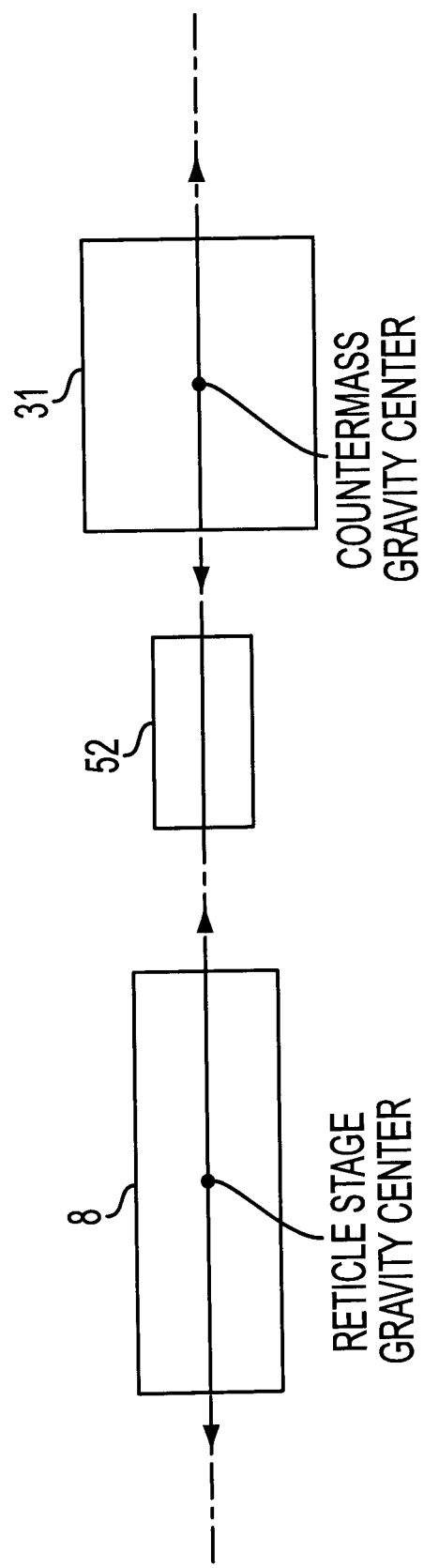
FIG. 5 is a schematic view for explaining movement direction and gravity center position.

FIG. 5 illustrates the relation among the reticle stage 8, the electromagnetic joint 52 and the countermass 31, with respect to the movement direction and gravity center position.

In FIG. 5, arrows depict movement directions of gravity centers and also they denote axes of thrusts applied. Both of the reticle stage 8 and the countermass 31 are disposed so that a drive axis through which the thrust operates passes through the gravity center. Also, the thrust of the electromagnetic joint 52 is arranged to passe about the gravity centers of the reticle stage 8 and the countermass 31. Namely, in this embodiment, the direction of a force line, connecting the gravity center of the countermass 31 and the neighborhood of the reticle stage 8 gravity center, and respective movement directions are substantially registered with each other. Here, the term "thrust" refers to a resultant force of thrust vectors of two linear motors disposed at the opposite sides of the reticle stage. This is also the case with the thrust of the electromagnetic joint 52 and the countermass 31.

Figure 6:
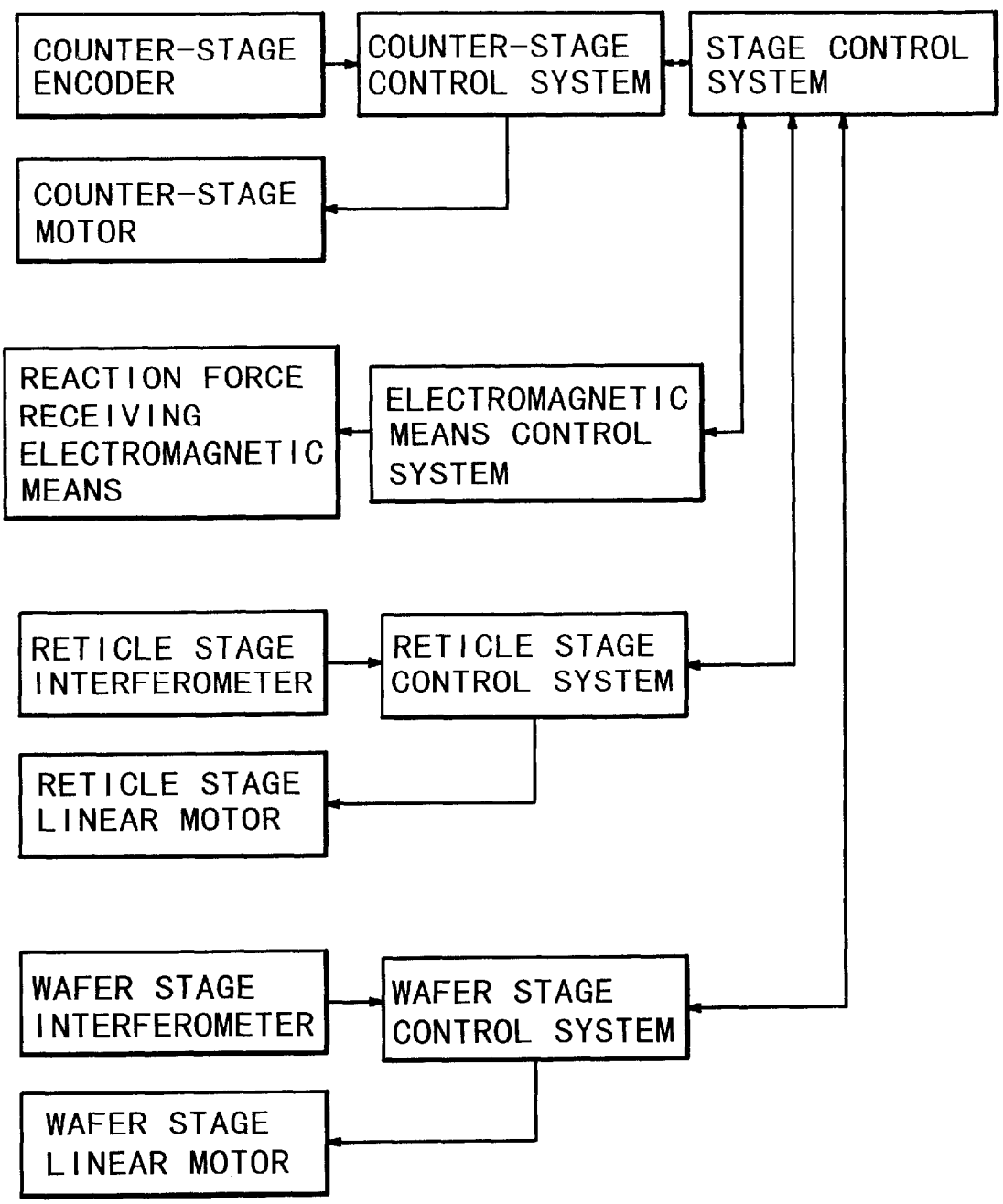
FIG. 6 is a block diagram of a control system in the first embodiment of the present invention.

FIG. 6 is a schematic view of a control system for controlling operations of the reticle stage, the electromagnetic joint and the countermass.

The reticle stage 8 and the wafer stage 9 perform harmonized operations necessary for operations of the exposure apparatus such as a scanning exposure operation. The control related to movement of the countermass 31 is made on the basis of a signal to be used for movement of the reticle stage. The method of using the signal to be used for reticle stage 8 movement is accomplished so that the sum of the kinetic amounts of the reticle stage and the countermass 31 always becomes substantially equal to zero. More specifically, if the position designated value for the reticle stage at a certain time moment t is Y(t), the position designated value C(t) for the countermass may be set to satisfy C(t)=Y(t)·M/m+L. The negative symbol represents that the direction is opposite. While taking respective origins as zero and with the orientation being set in the same direction, the positions are defined with respect to a coordinate system. L denotes an offset amount. The electromagnetic joint produces a thrust corresponding to the driving force of the linear motor of the reticle stage, by which drive reactive force of the reticle stage is transmitted to the countermass.

Alternatively, the countermass 31 may be controlled as follows. A thrust may be applied to the countermass such that a thrust to be produced at the countermass may be in the opposite direction and of the same amount as the thrust produced at the reticle stage 8. This control method provides, in principle, the same result as the control method described before.

Figure 7:
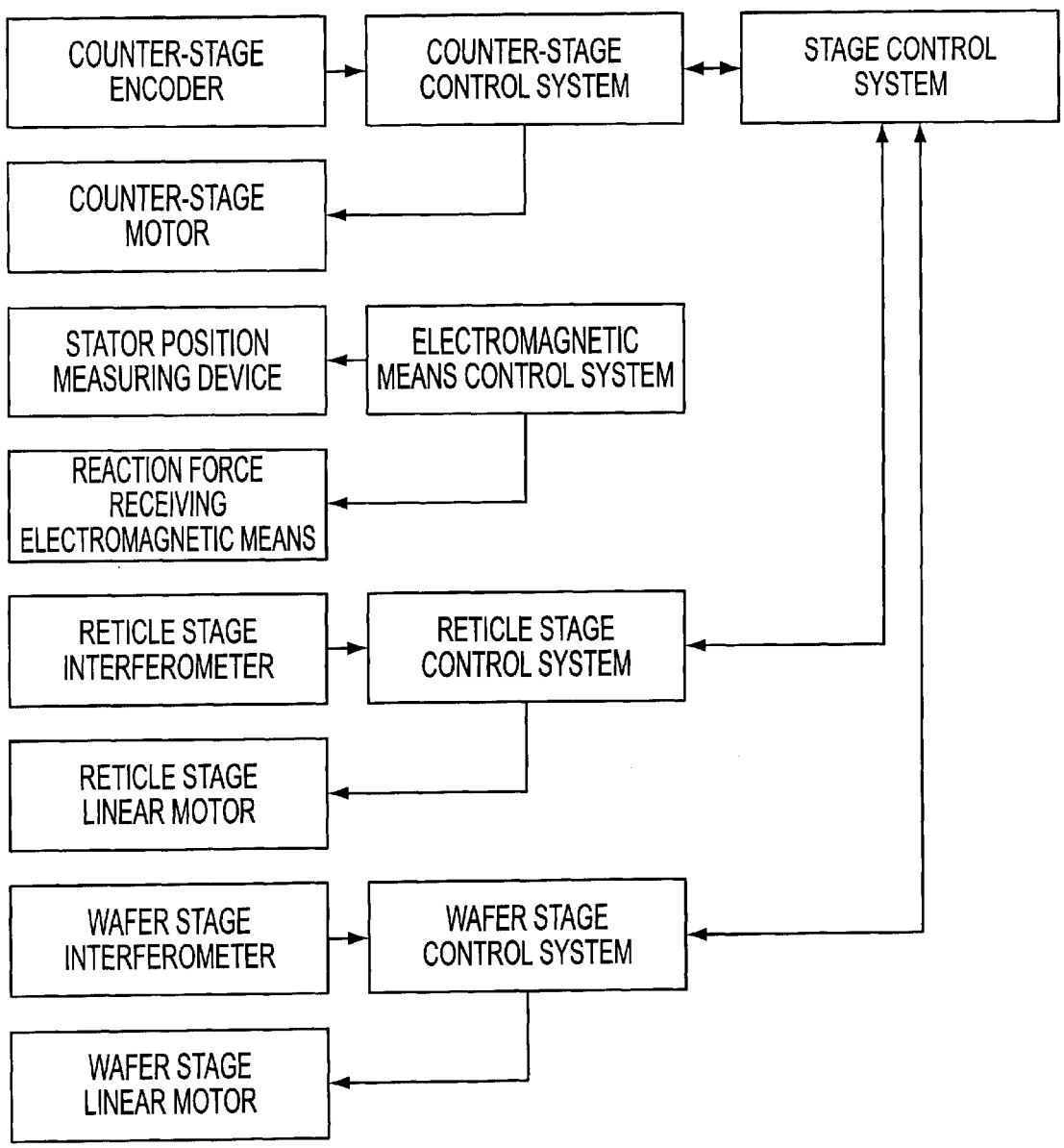
FIG. 7 is a block diagram of a control system in the first embodiment, using a distance measuring sensor.

As an alternative control method for the countermass 31, a distance measuring sensor 20 (FIG. 2) for measuring movement distance between the linear motor stator 22 of the reticle stage 8 and the barrel base 11 or the stage supporting member 40 may be used. FIG. 7 shows a control system corresponding to this control method.

In this control method, the relative position of the reticle stage stator 22 and the barrel base 11 or the stage supporting member 40 is detected, and control is made so that their relative position does not change. The reactive force of the reticle stage 8 can be consequently transmitted to the countermass side.

The control method for the countermass 31 in this method may be the same as the control method described hereinbefore. According to this method, since vibration of the reticle stage stator is directly suppressed, the reactive force of the reticle stage during acceleration and deceleration can consequently be transmitted to the countermass side and, additionally, vibration of the reticle stage stator can be reduced Therefore, the speed electro motive force attributable to relative vibration relative to the reticle stage movable element is made small, and electric and external disturbance are made small. Thus, the reticle stage control precision can be improved.

The position control precision in relation to movement of the countermass 31 may be lower than the position control precision in relation to movement of the reticle stage 8. One object for moving the countermass is to reduce transmission of the reactive force, due to movement of the reticle stage 8, to the floor or the like. Therefore, what is required for the countermass 31 during acceleration and deceleration of the reticle stage 8 is to produce a reactive force substantially corresponding to it. Precise position control is not required. Thus, as for the measuring means for position control of the countermass 31, it is not necessary to use a high precision laser measuring device such as a laser interferometer which measures the position of the reticle stage. An encoder with an optical scale, for example, having a lower resolution as compared with the resolution of a laser interferometer, may be used with an advantage in cost.

While the foregoing description has been made with respect to the structure for receiving a reactive force of a reticle stage, a similar structure may be incorporated into the wafer stage 9.

As regards free support for the driving stator 22 of the reticle stage 8 with respect to the movement direction, the leaf spring 19 may be replaced preferably by a straight motion guide for providing a smooth guide along a straight line, such as an air bearing (static pressure bearing) or a cross-roller bearing (roll bearing), for example. Since transmission of a reactive force of stage movement to the floor is larger with a larger friction of guiding, preferably, the friction should be kept small.

The linear motor used in this embodiment as the driving mechanism comprises a movable magnet type linear motor However, the invention is not limited to this. A fixed magnet type linear motor or a voice coil type linear motor may be used. In the case of a fixed magnet type linear motor, the magnet portion may be connected to the connecting mechanism Further, the driving means is not limited to a linear motor. A ball screw or a rotary motor, for example, may be used.

In this embodiment, a stator for moving the stage and an independently disposed countermass are connected to each other, such that a reactive force produced with drive of the stage can be reduced through drive of the countermass. As a result of this, vibration within the exposure apparatus or on the floor produced by the reactive force can be reduced.

Further, since the stator for the stage is supported freely with respect to the movement direction, a reactive force is not transmitted to the base which supports the stage. Therefore, vibration within the exposure apparatus can be reduced.

Additionally, because of the use of a non-contact electromagnetic joint, unwanted vibration in a machine chamber where the countermass is disposed is less transmitted to the barrel base or major assembly of the exposure apparatus. Also, relative deformation of the barrel base and the machine chamber can be suppressed. Moreover, adjustment during assembly of the system is very easy. However, the invention is not limited to this. Without such an electromagnetic joint, the stator of the stage and the stator of the countermass may be connected directly to each other.

Embodiment 2

Figure 8:
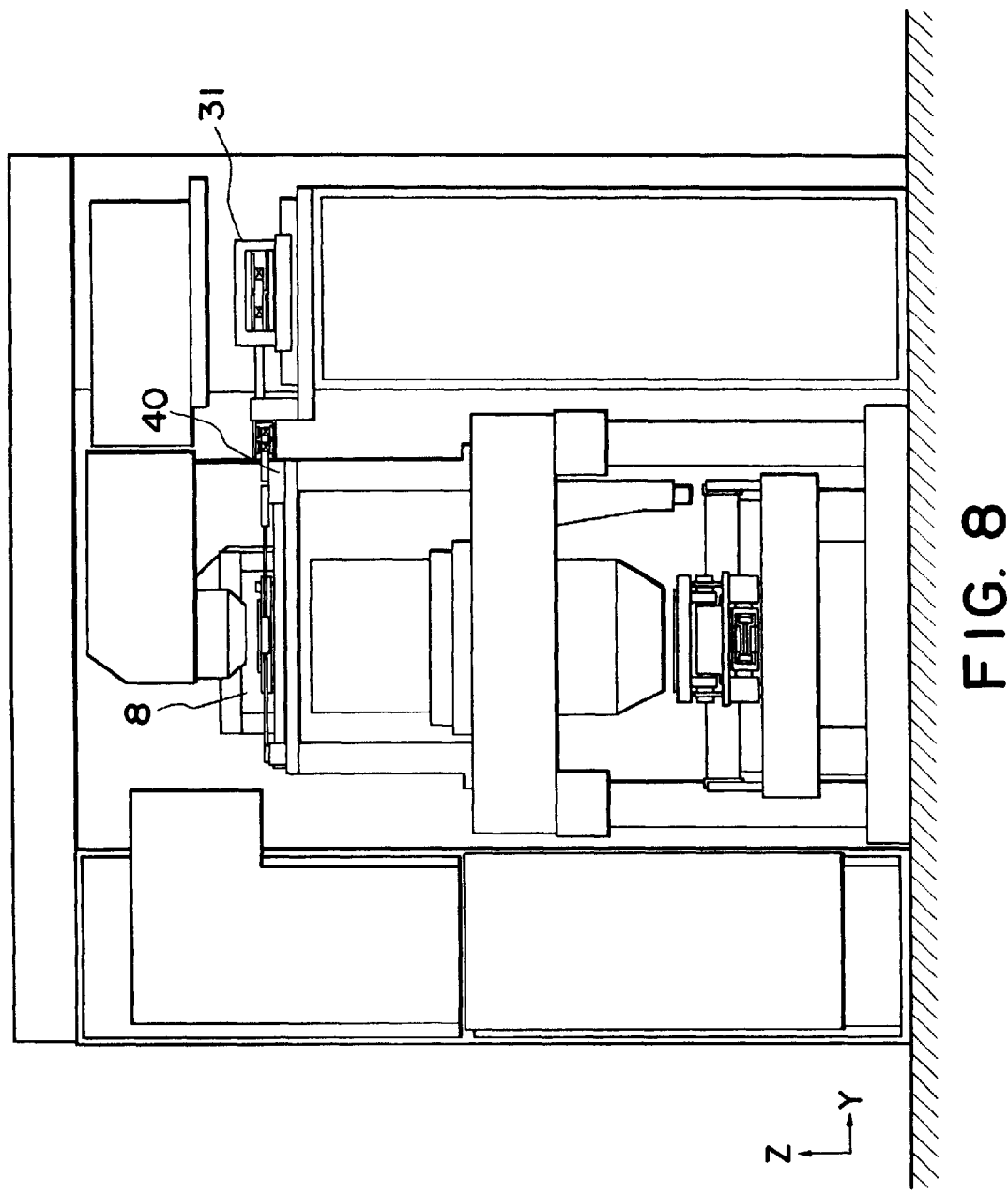
FIG. 8 is a schematic view of an exposure apparatus according to a second embodiment of the present invention.

FIG. 8 is a schematic view of an exposure apparatus according to a second embodiment of the present invention.

While in the preceding embodiment the stator for the linear motor for moving the reticle stage is supported freely, in this embodiment the linear motor stator is fixed to a supporting member.

In FIG. 8, elements corresponding to those of the preceding embodiment are denoted by the same reference numerals. A description thereof will be omitted.

Electromagnetic joint 52 (connecting mechanism) of this embodiment serves to connect a reticle stage supporting member 40, which is a component of a stage mechanism, to a countermass supporting member 41 which is a component of a countermass mechanism provided substantially independently of the stage mechanism. Since, however, the supporting member (40 or 41) and a linear motor stator (22 or 33) are fixed, the electromagnetic joint 52 functioning as a connecting mechanism may be connected to the stator (22 or 33).

The relation among the reticle stage 8, the electromagnetic joint 52 and the countermass 33 with respect to the gravity center and driving axis, is substantially the same as that in the preceding embodiment.

Figure 9:
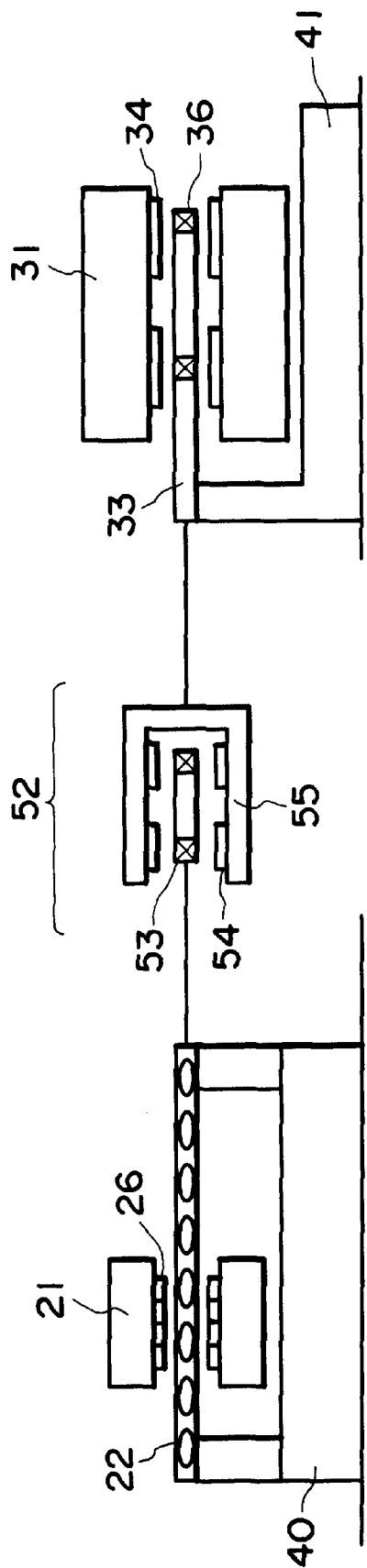
FIG. 9 is a schematic view of a model of a stage system in the second embodiment of the present invention.

FIG. 9 shows a model of a stage system according to this embodiment.

When the reticle stage 8 is driven, a reactive force is produced during acceleration or deceleration of the stage. Since, in this embodiment, the linear motor stator 22 and the stage supporting member 40 are fixed, the reactive force is transmitted to the countermass 31 through the stage supporting member 40 and through the electromagnetic joint 52.

Also, in the countermass 31, a reactive force is produced with movement of the countermass 31. Similarly to the case of reticle stage 8, the reactive force is transmitted from the stator 33 to the supporting member and then to the electromagnetic joint 52.

The movement amount of the countermass 31 necessary for reducing such a reactive force is substantially the same as in the preceding embodiment.

Since, in this embodiment, the linear motor stator at the reticle stage side is held in a positional relation fixed to the stage supporting member, there is no necessity of using a measuring sensor for measuring a relative movement of the linear motor stator and the barrel base in the preceding embodiment. Further, in this embodiment, it is not always necessary to use a linear motor as the driving means for the reticle stage. A ball screw, for example, may be used. The freedom of the reticle stage structure is high, in this embodiment.

Similar advantageous results as attainable with the preceding embodiment can be provided by the structure according to this embodiment, and use of the countermass 31 effectively reduces the reactive force. This enables reduction of vibration to be produced by the reactive force, and assures high speed and high precision positioning. Further, because the stator 22 for moving the stage 8 is fixed to the supporting member 40, the structure of the stage system is simplified, with a result of reduction in weight and cost.

With regard to the stators 22 and 33 of the reticle stage and the countermass, one of them may be supported freely with respect to the movement direction as in the preceding embodiment. Substantially the same advantageous result will be attainable.

Embodiment 3

Figure 10:
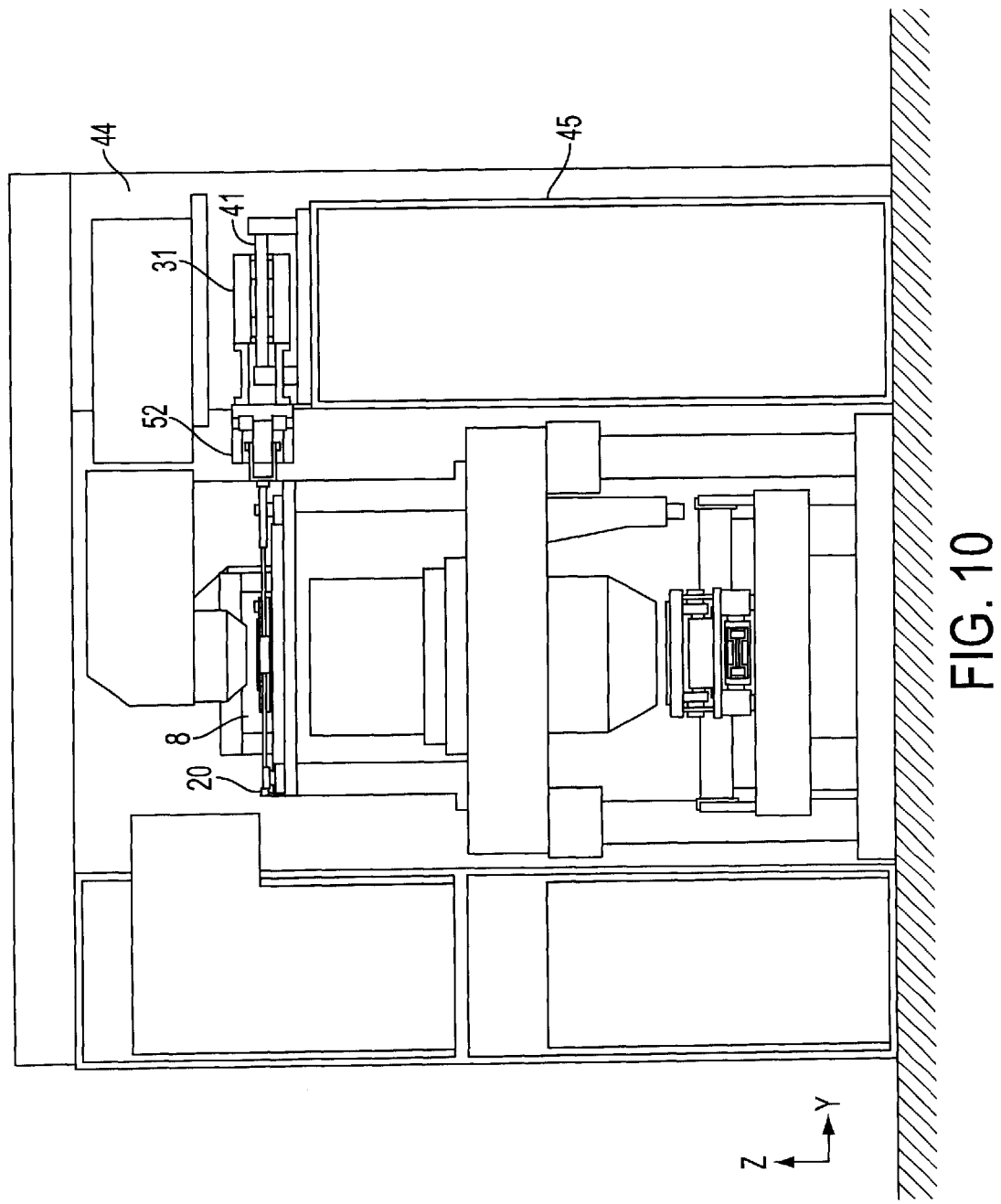
FIG. 10 is a schematic view of an exposure apparatus according to a third embodiment of the present invention.

FIG. 10 is a schematic view of an exposure apparatus according to a third embodiment of the present invention.

Since, in the stage system of this embodiment, the structure at the reticle stage side (stage mechanism) is the same as that of the preceding embodiment, a description of it will be omitted.

In the preceding embodiment, the linear motor stator or the stage supporting member is connected to the countermass stator or the supporting member through a connecting mechanism. In this embodiment, as compared therewith, the linear motor stator or the supporting member is connected to the countermass Also, at the connection, the driving of the countermass is performed. This differs from the preceding embodiment.

The reticle stage 8 comprises a non-contact linear motor, similar to that of the preceding embodiment. Denoted at 31 is a countermass, and denoted at 41 is a countermass supporting member The mass of the countermass is ten times larger than the mass of the reticle stage. Thus, the stroke of the countermass is about 1/10. Denoted at 52 is an electromagnetic joint (connecting means). The electromagnetic joint 52 constitutes a linear motor (thrust producing means) for driving a counter-stage, and it comprises a non-contact voice coil type motor This motor produces a thrust, over a stroke sufficient to the stroke of the counter-stage.

An end of the electromagnetic joint is connected to a linear motor stator 22 of the reticle stage 8, and the other end is connected to the countermass 31. Namely, the linear motor stator 22 and the countermass 31 are connected to each other, through the connecting means 52.

The electromagnetic joint 52 is supported on a barrel base, and it is arranged to be movable in a direction producing a magnetic force to the barrel base. Thus, any motion of the stator in the thrust producing direction is not transmitted to the barrel base.

Figure 11:
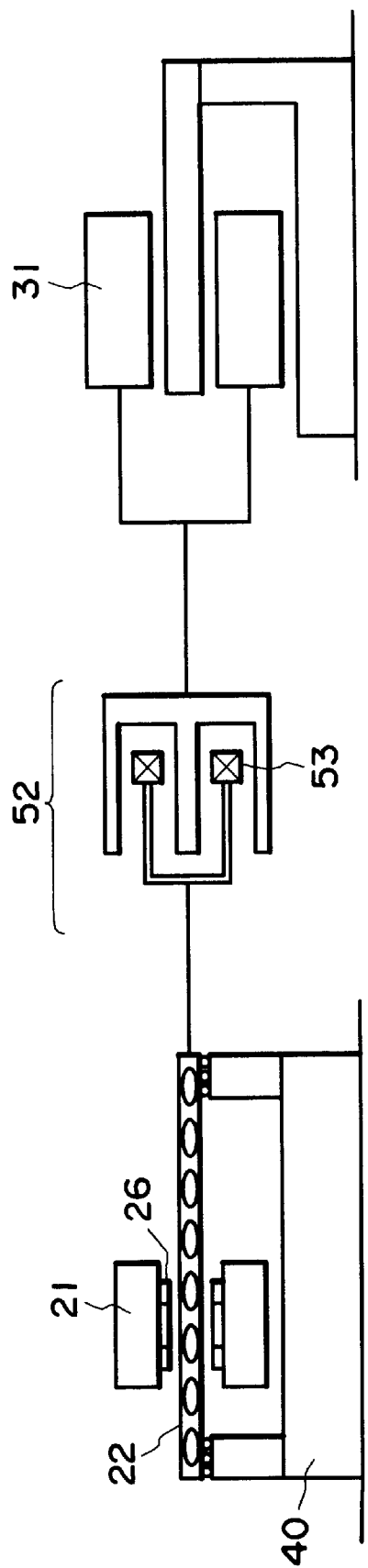
FIG. 11 is a schematic view of a model of a stage system in the third embodiment of the present invention.

FIG. 11 shows a model of a stage system according to this embodiment.

As the reticle stage accelerates or decelerates for an exposure operation, a reactive force is produced at the linear motor stator 22 which is driving means for the reticle stage. The produced reactive force is transmitted to the connecting means 52. On the other hand, to the countermass 31, a thrust is applied from the linear motor for driving the countermass. As for the driving of the countermass 31, a thrust may be applied to reduce the above-described reactive force. The thrust in this case is of substantially the same amount as the thrust used for moving the countermass in the preceding embodiment.

Also, in this embodiment, the relation among the reticle stage, the electromagnetic joint, and the countermass with respect to the gravity center and drive axis, is the same as in the preceding embodiment.

In this embodiment, the stator 22 of the reticle stage is supported movably in a direction to produce a thrust to the stage supporting member 40. Therefore, any motion of the stator in the thrust direction is not transmitted to the barrel base. Denoted at 20 is a distance measuring sensor which serves to detect relative position of the barrel base 11 or the stage supporting member 40 and the stator 22.

Figure 12:
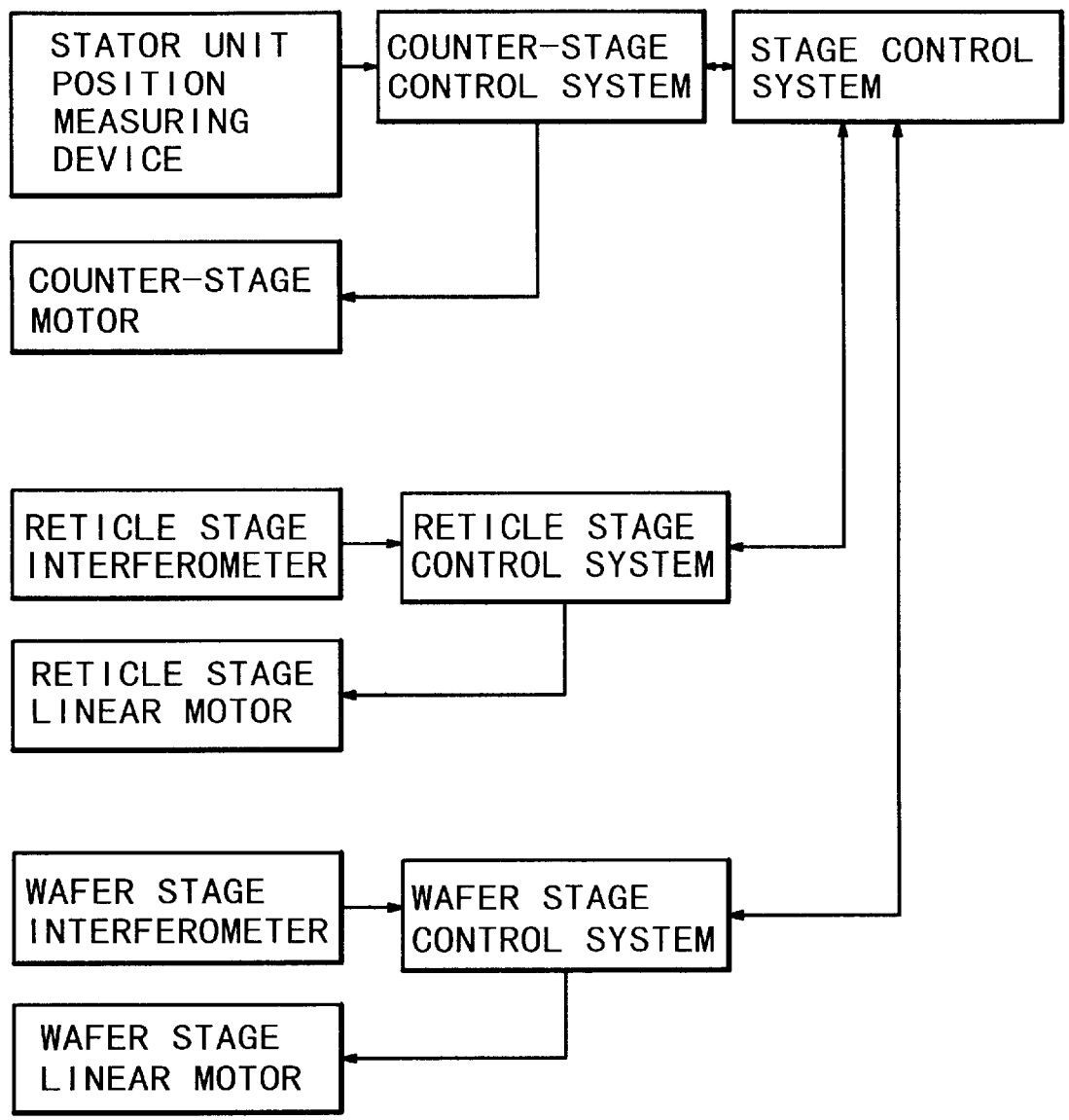
FIG. 12 is a block diagram of a control system according to the second embodiment of the present invention.

FIG. 12 is a schematic view of an example of a control system for controlling the operation of the reticle stage 8 and the countermass 31, in the structure according to this embodiment.

Like the preceding embodiment, the reticle stage 8 and the wafer stage 9 perform harmonized operation necessary for the operation of the exposure apparatus such as a scanning exposure operation, for example. The relative position of the stator 22 of the reticle stage 8 and the barrel base 11 or stage supporting member is detected, and control is made so that their relative position is unchanged. The electromagnetic joint consequently produces a thrust substantially corresponding to the driving force of the linear motor of the reticle stage, such that a reactive force of the reticle stage can be transmitted to the frame 45 of the machine chamber 44. The linear motor of the countermass 31 is controlled on the basis of a position sensor signal. More specifically, the position sensor signal is used to control the electric current flowing through the stator of the linear motor for driving the countermass, so that the stator at the reticle stage side is placed at a predetermined position with respect to the barrel base.

Through this control, the linear motor of the countermass consequently produces a thrust substantially corresponding to the linear motor of the reticle stage, and the countermass is driven so that the sum of the kinetic amount of the countermass and the kinetic amount of the reticle stage becomes substantially equal to zero. In this embodiment, therefore, transmission of a reactive force of the reticle stage to the barrel base 11 of the major assembly of the exposure apparatus can be reduced Additionally, since the kinetic amount is canceled as a whole, there is substantially no vibration emitted outwardly of the exposure apparatus. Further, mechanical vibration of the machine chamber 44 is intercepted by the non-contact linear motor means of the countermass and, therefore, it is not transmitted to the reticle stage side. Since the magnets and yokes of the linear motor of the electromagnetic joint used for the driving of the countermass can be utilized as the mass of the countermass, there is an advantage in designing a voice coil motor of a long stroke.

Moreover, in this embodiment, the stator 22 at the reticle stage side or the supporting member 41 is connected to the separately disposed countermass 31 through a connecting mechanism comprising an electromagnetic joint, and a reactive force produced with drive of the stage 8 is reduced by applying a thrust to the countermass 31. By this, vibration produced at the exposure apparatus or at the floor, for example, due to the reactive force, can be reduced.

Further, in this embodiment, an electromagnetic joint is connected to a countermass. In this form, the driving of the countermass may be performed by driving means provided on the countermass side, like the first or second embodiment.

In this embodiment, the stator of the reticle stage is supported by a supporting member freely with respect to the stage movement direction, as in the first embodiment.

However, as in the second embodiment, the stator of the reticle stage may be fixed to the supporting member, without changing the basic concept of this embodiment. On that occasion, an end of the connecting means 52 at the reticle stage side may be connected to the linear motor stator of the reticle stage or it may be fixed to the stage supporting member. Further, there is no necessity of use of a measuring sensor for measuring relative movement of the stator and the barrel base.

Embodiment 4

Figure 13:
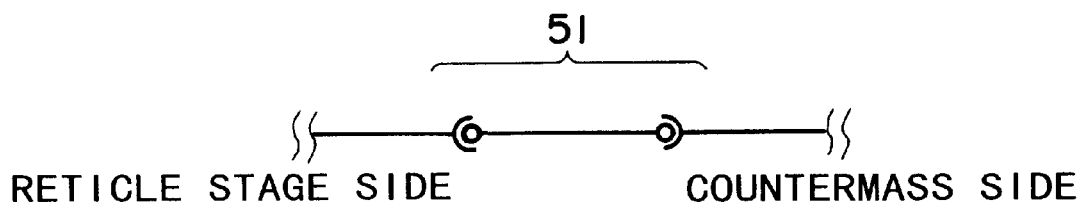
FIG. 13 is schematic view of a rotary joint used in a fourth embodiment of the present invention.

FIG. 13 is a schematic view of a connecting mechanism for connecting, in a stage system of the present invention, a stator 22 at the reticle stage side or a stage supporting member 41 to a supporting member 41 at the countermass side (countermass mechanism), for example.

The connecting mechanism in the preceding embodiment uses a non-contact electromagnetic joint. In this embodiment, as compared, the connecting mechanism uses a rotary joint 51 being rotatable.

As illustrated, a rotatable rotary joint is disposed between the reticle stage 8 and the countermass 31. The reticle stage and the countermass have a structure similar to that of the preceding embodiment. The rotary joint 51 is effective to reduce an influence due to a deviation between the driving axis of the reticle stage 8 and the driving axis of the countermass 31. However, preferably, as in the preceding embodiment, the driving axis of the reticle stage passes about the gravity center of the reticle stage while the driving axis of the countermass passes about the gravity center of the countermass. The components may preferably be disposed so that their driving axes are substantially aligned with each other, and then the rotary joint may preferably be interposed.

Figure 14:
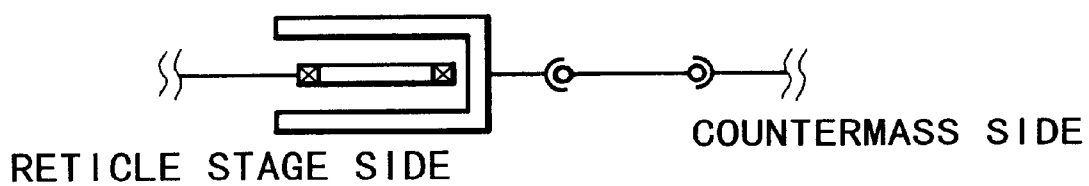
FIG. 14 is a schematic view of connecting means in the fourth embodiment.

Further, as shown in FIG. 14, a rotary joint 51 and an electromagnetic joint 52 may be connected in series to provide a connecting mechanism. This provides substantially the same advantageous effect. Additionally, because of interposition of the rotary joint, even if there is a misaligned among the driving axis of the reticle stage, the driving axis of the electromagnetic joint and the driving axis of the countermass, the influence of it may be reduced. Also, in this case, however, preferably these axes may be set in alignment with each other

Embodiment 5

Figure 15:
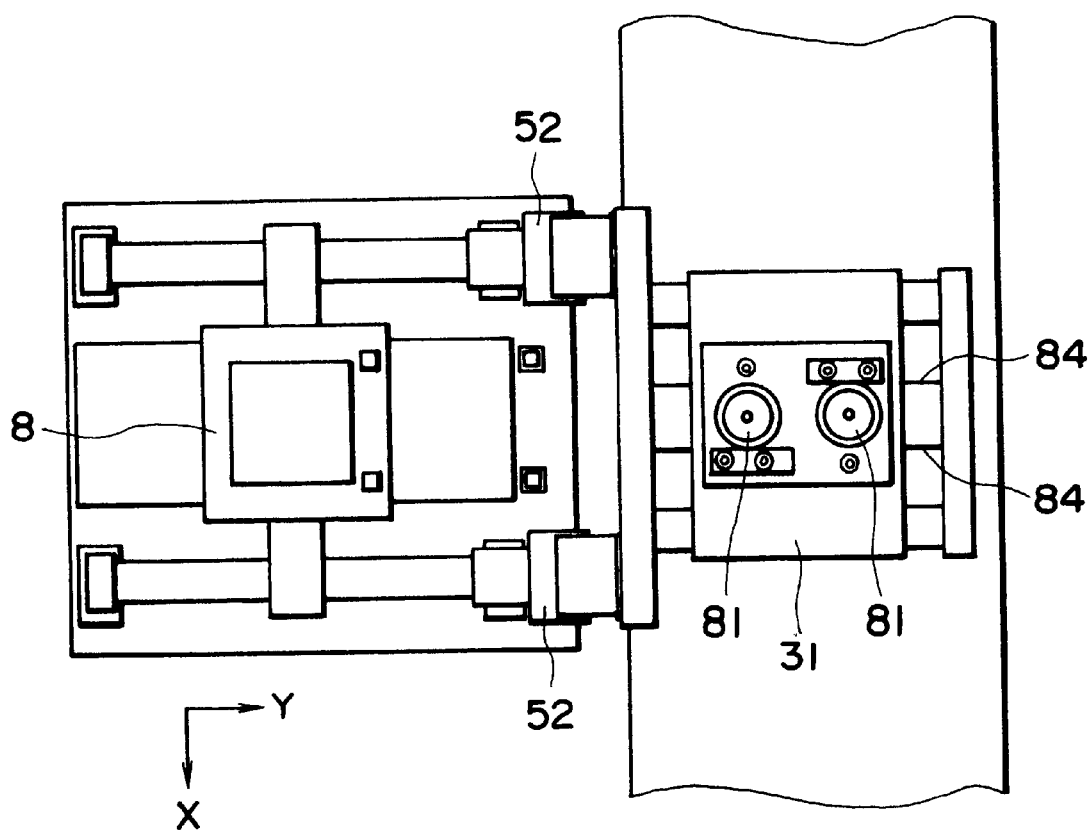
FIG. 15 is a plan view of a countermass with a capstan roller, in a fifth embodiment of the present invention.
Figure 16:
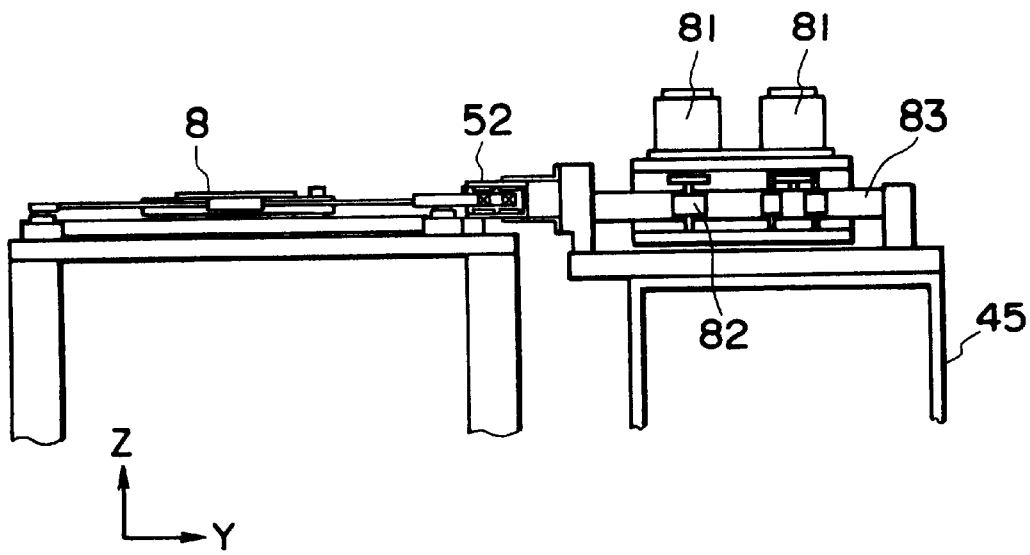
FIG. 16 is a sectional view of the countermass with a capstan roller, in the fifth embodiment of the present invention.

FIGS. 15 and 16 show another embodiment of the countermass, wherein FIG. 15 is a plan view and FIG. 16 is a sectional view.

In this embodiment, the whole driving motor which is a component of the countermass mechanism is provided as a portion of the countermass.

The countermass illustrated has driving motors 81 mounted thereon. Each driving motor 81 is provided with a capstan roller. Denoted at 82 are the capstan rollers to be driven by respective motors. Denoted at 83 is a guide for guiding the countermass, and it is fixed to a stator. Denoted at 84 are friction surfaces for the capstan rollers, and there are two such friction surfaces in association with respective capstan rollers.

The structure of and control method for the countermass side are essentially the same as those of the preceding embodiment.

There are two driving motors as illustrated, and they are rotated in opposite directions. By this, a moment reactive force to be produced at the countermass can be suppressed. The countermass having a driving source mounted thereon is effective to enlarge the weight of the countermass efficiently. Therefore, the movement amount of the countermass can be made smaller, and the structure is advantageous in size and cost.

Figure 17:
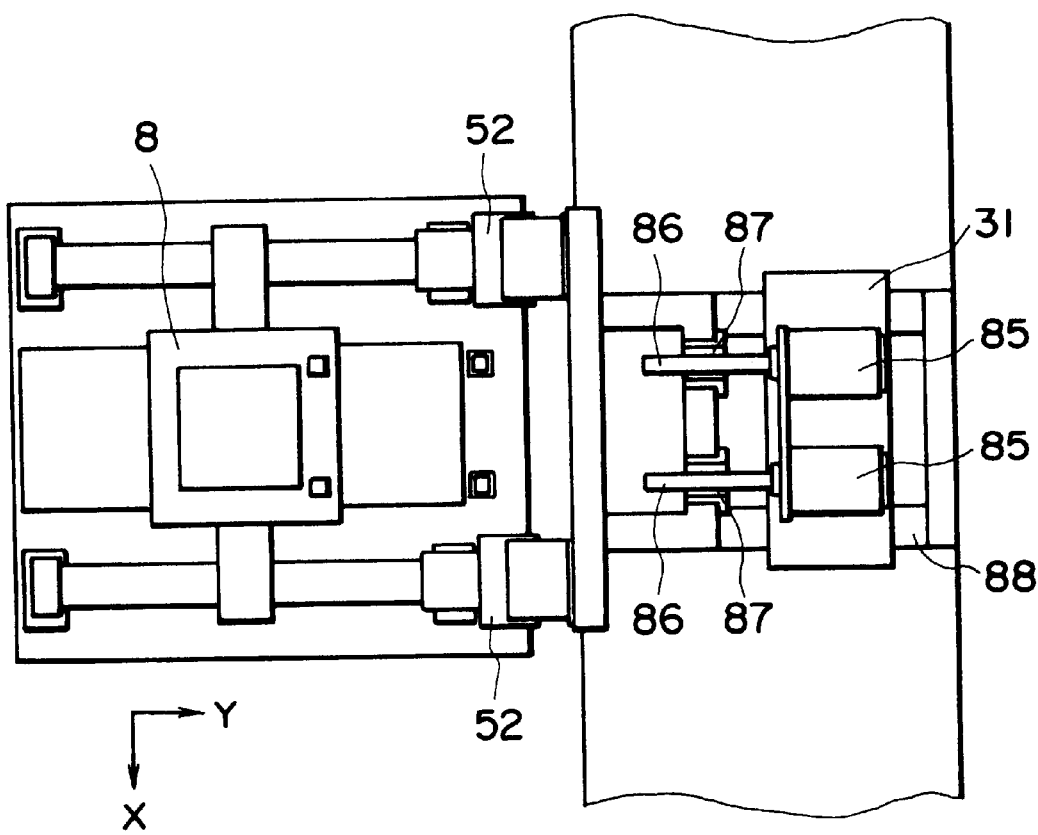
FIG. 17 is a plan view of a countermass with a ball screw, in the fifth embodiment of the present invention.
Figure 18:
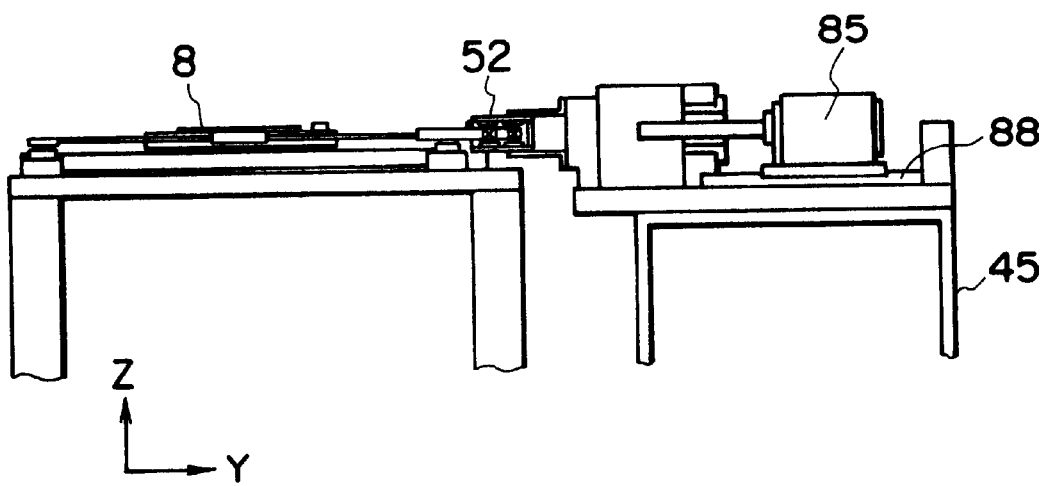
FIG. 18 is a sectional view of the countermass with a ball screw, in the fifth embodiment of the present invention.

The countermass may be structured such as shown in FIGS. 17 and 18, wherein FIG. 17 is a plan view and FIG. 18 is a sectional view.

This embodiment is similar to the preceding example wherein a driving motor is mounted on the countermass. As a driving mechanism, a screw and a ball nut are used.

In these drawings, the countermass 31 has two motors 85 mounted thereon. Each motor has a motor gear (not shown) mounted there within, and it is designed to provide a desired rotational speed. Denoted at 86 are screws having threads in opposite directions. Namely, if one is clockwise, the other is counterclockwise. Ball nuts 87 corresponding to the screws are fixedly mounted on the stator. Here, the stator is fixed to a machine chamber 44. Denoted at 88 is a guide for guiding the countermass 31 including the driving motors 85. The driving screws are so controlled that they are rotated in opposite directions and by the same rotational amount.

Also, in the countermass of this embodiment, by rotating the two motors in opposite directions, a reactive force of a driving moment due to motor rotation of the countermass, can be canceled. Thbrefore, outward emission of a moment reactive forced due to motor rotation can be prevented. Further, because motors and screws as a drive source are mounted on the countermass, the weight of the countermass can be enlarged efficiently.

Further, since the countermass 31 is mounted on a mechanical frame which is separate from the stage system major assembly (stage mechanism), it may be provided by any component within the exposure chamber or machine chamber of the exposure apparatus which produces a small effect even if it is moved. Examples may be a driver, a transformer, a lighting device such as a lamp, and a control board. This accomplishes efficient enlargement of the weight of the countermass.

Embodiment 6

Figure 19:
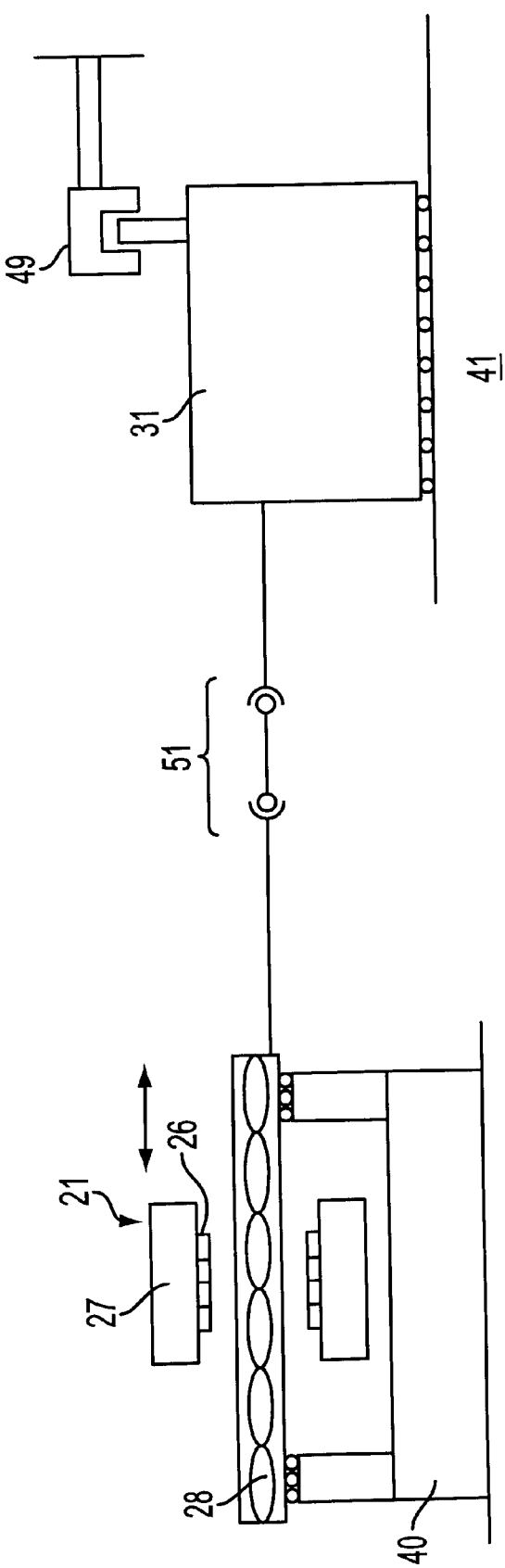
FIG. 19 is a schematic view of a model of stage system according to a sixth embodiment of the present invention.

FIG. 19 is a schematic view of a stage system according to a sixth embodiment of the present invention.

The basic structure of this embodiment is similar to the structure of the stage system of the preceding embodiment.

The stage 8 of this embodiment comprises an electromagnetic actuator (linear motor) including a movable element 21, coils 28 and a guide. The movable element 21 comprises a yoke 27 and magnets 26. The coil at the stage side is connected to the countermass 31 having a guide, through a rotary joint 51, which is a rotatable connecting mechanism.

The rotary joint 51 which is a rotatable connecting mechanism is effective to reduce a deviation in a driving axis between the countermass 31 and the coil 28.

Like the preceding embodiment, the countermass 31 is mounted on a structure such as a machine chamber frame, for example, which is separate and independent from the stage. Further, in this embodiment, the countermass side has no driving means separate from the stage.

In the structure of this embodiment, if it is assumed that there is no friction between the coil 28 and the guide and between the movable element 21 and the coil 28, as the movable element is driven in the direction of an arrow, the coil 28 receives a reactive force in an opposite direction and corresponding to the product of the sum (M) of the mass of the stage 8 and the movable element 21 by the acceleration (A) required for the driving. If the sum of the mass of the countermass 31, the connecting mechanism 51 and the coil 28 is m, then the acceleration a applied to the countermass 31, the connecting mechanism 51 and the coil 28 is expressed by:

$$a = A \times M / m$$

Namely, if A and M are determined values, the acceleration can be made smaller with an increase in m, and the movable range (stroke) of the countermass can be made smaller. The shortening of the stroke enables reducing the influence of a movement load of the countermass supporting member which supports the countermass.

Since the countermass is disposed separately from the exposure apparatus major assembly, preferably it may be provided by elements inside the chamber of the exposure apparatus or a machine chamber, causing less influence with displacement. Examples may be a voltage source driver, a transformer, a lighting device such as a lamp, and a control board.

As for the guide, it may preferably be one which provides smooth straight guiding, such as an air bearing or cross-roller bearing, for example. Since transmission of a reactive force of stage movement to the floor is larger with a larger friction of guiding, preferably, the friction should be kept small.

Due to the influence of friction, for example, there is a possibility that a positional deviation is produced at the countermass with respect to the countermass supporting member. In consideration of this, a moving mechanism 49 for moving the countermass may be provided at the countermass side, to correct the positional deviation of the countermass. The moving mechanism may be arranged so that, as the countermass moves and reaches an end point of its stroke, it is returned to its neutral position. Normally, for preventing a decrease of productivity of the exposure apparatus, the moving mechanism may be operated when wafers are changed.

The stage system of this embodiment provides the same advantageous effect as that of the preceding embodiment and, additionally, since there is no necessity of use of separate driving means for the countermass, there is an advantage with respect to simplification of the structure, reduction in size and cost of the structure.

Further, the provision of moving mechanism is effective to correct positional deviation of the countermass, and it is effective to prevent decrease of productivity of the exposure apparatus.

While the stage of this embodiment uses a movable magnet type linear motor, a fixed magnet type linear motor such as shown in FIG. 2 may be used. On that occasion, the disposition of the coil and magnet may be opposite to that of the stage system of FIG. 19, and the magnet may be connected to the connecting mechanism.

Figure 20:
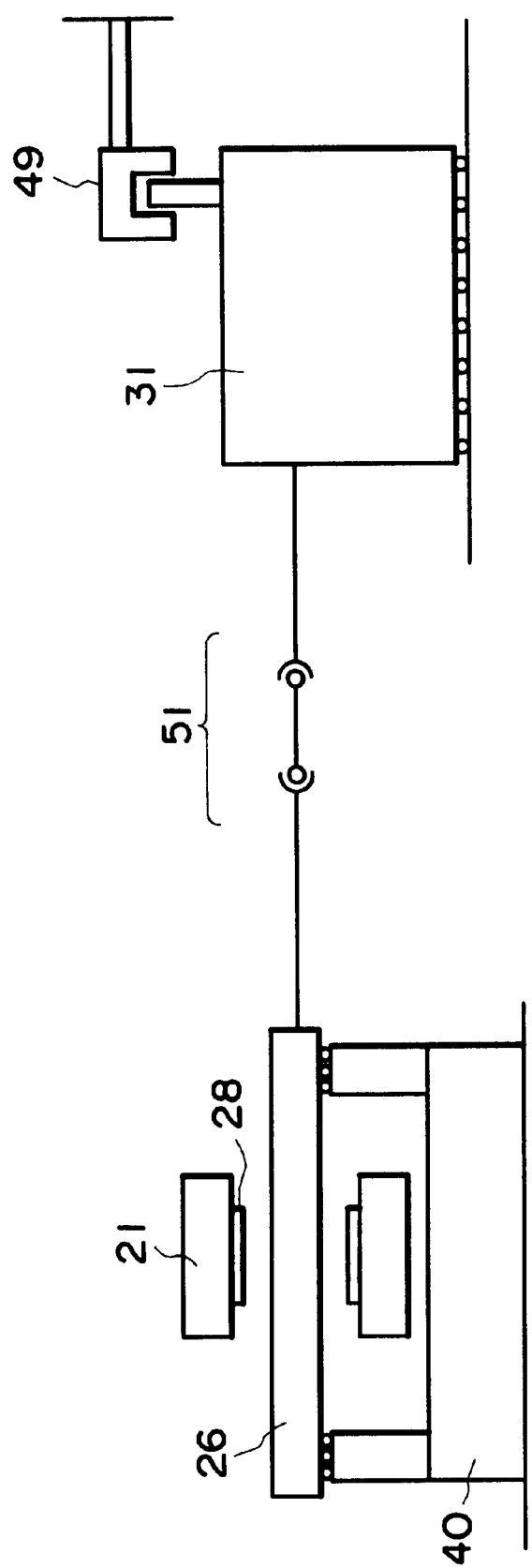
FIG. 20 is a schematic view of a model of a stage system having a movable coil type linear motor, in the sixth embodiment of the present invention.

FIG. 20 is a schematic view of a model of a stage system having a movable coil type linear motor, in the sixth embodiment of the present invention.

Figure 21:
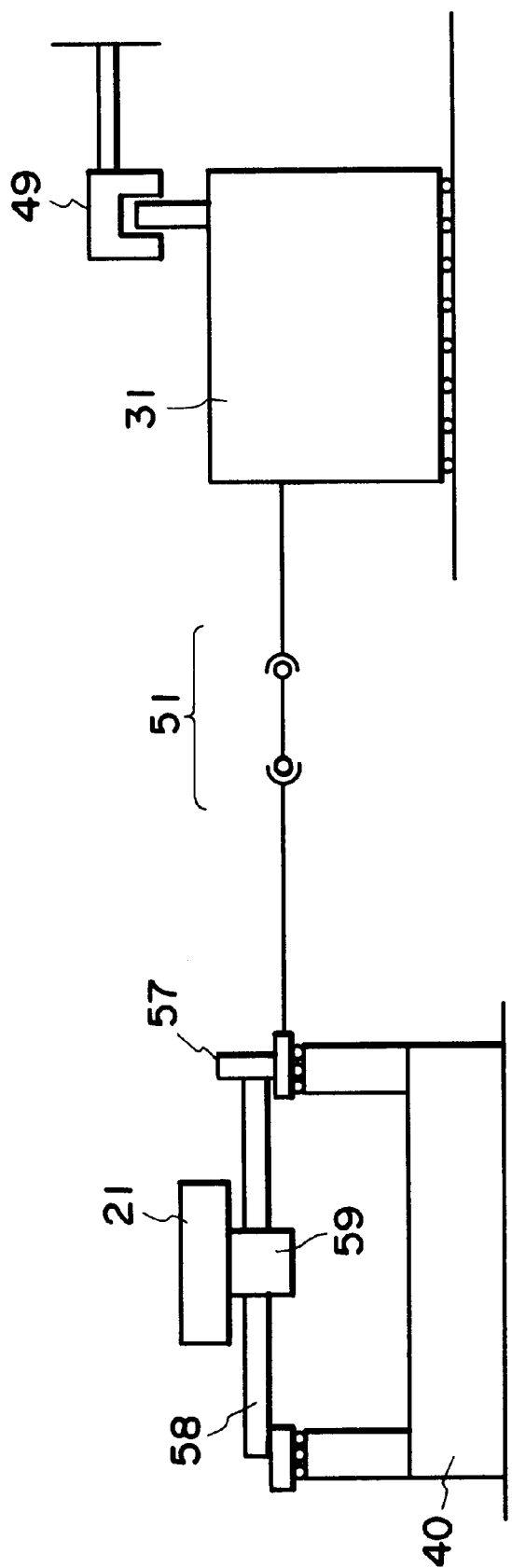
FIG. 21 is a schematic view of a model of a stage system with a ball screw, in the sixth embodiment of the present invention.

Further, as shown in FIG. 21, the stage structure may use a combination of a rotary motor and a straight motion guide 59 such as a roll bearing or static pressure bearing, for example. In this example, a ball nut may be provided at the stage side while a ball screw may be provided at the side connected to the connecting mechanism (i.e., at the side indirectly connected to the countermass). Substantially the same advantage as that of the preceding embodiment is attainable.

Figure 22:
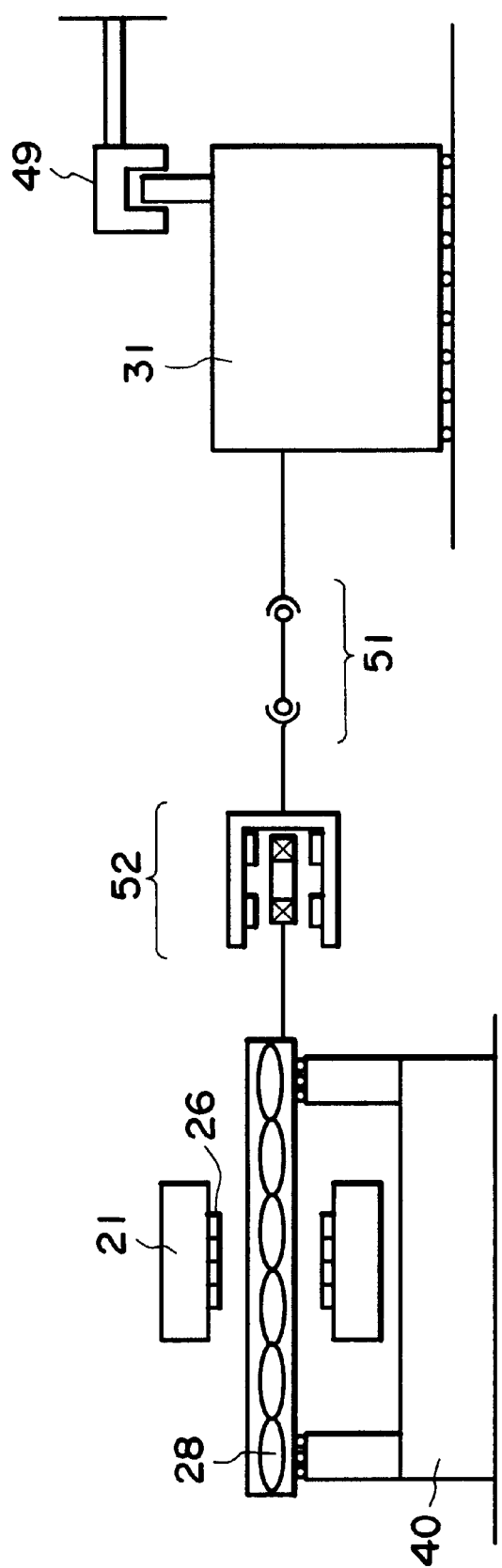
FIG. 22 is a schematic view of a model of a stage system with an electromagnetic joint, in the sixth embodiment of the present invention.

Further, as shown in FIG. 22, an electromagnetic joint such as described hereinbefore may be used for the connecting mechanism. Use of the electromagnetic joint is effective to reduce vibration at the countermass side which is undesirable for the exposure apparatus.

Also, in this embodiment, the gravity center position of the countermass should preferably be placed substantially at an extension of movement direction of the stage gravity center.

Embodiment 7

Next, an embodiment of a semiconductor device manufacturing method which uses an exposure apparatus such as described hereinbefore, will be explained.

Figure 23:
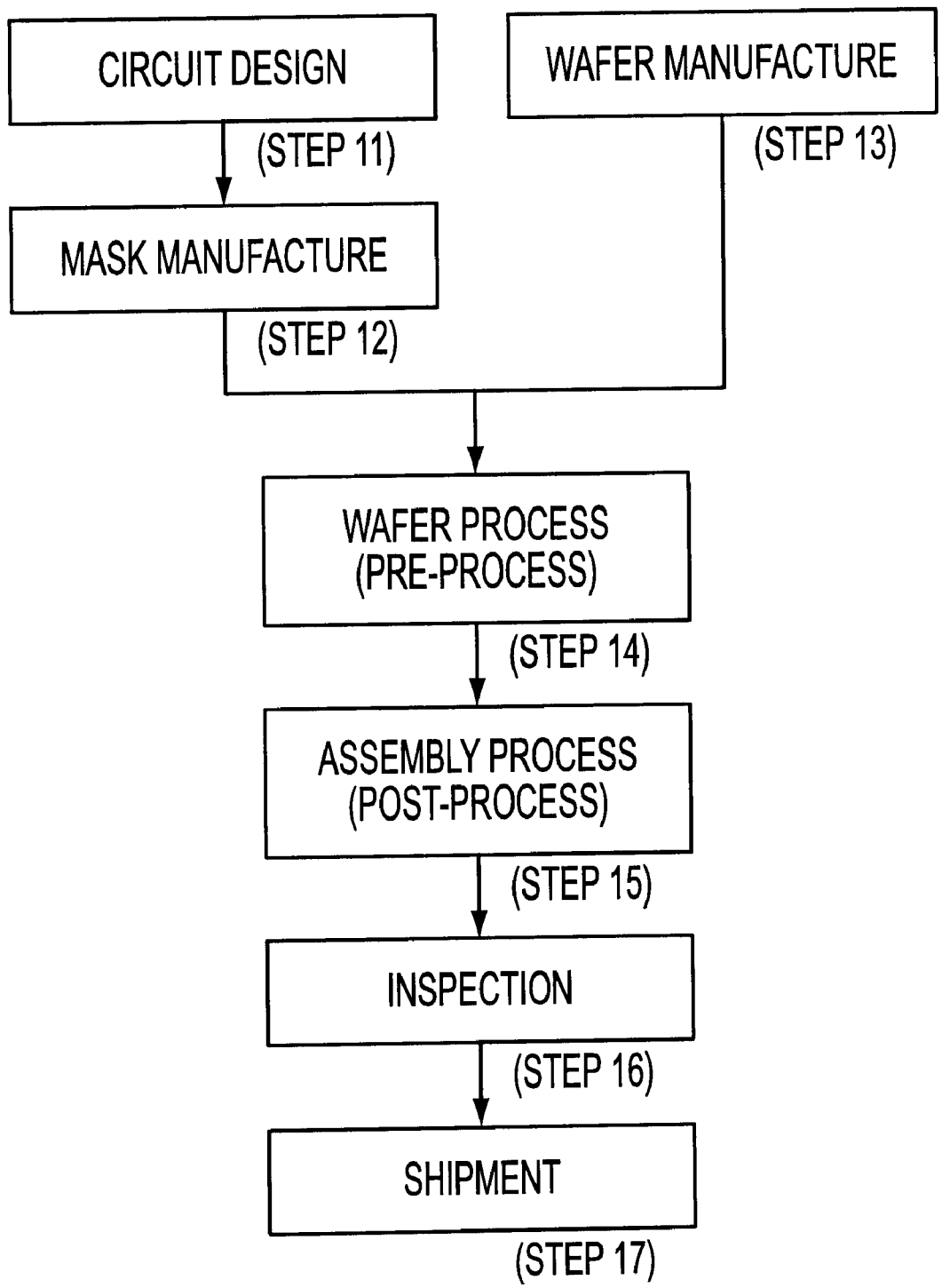
FIG. 23 is a flow chart of semiconductor device manufacturing processes.

FIG. 23 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, durability check and so on for the semiconductor devices provided by step 5, are carried out With these processes, semiconductor devices are completed and they are shipped (step 7).

Figure 24:
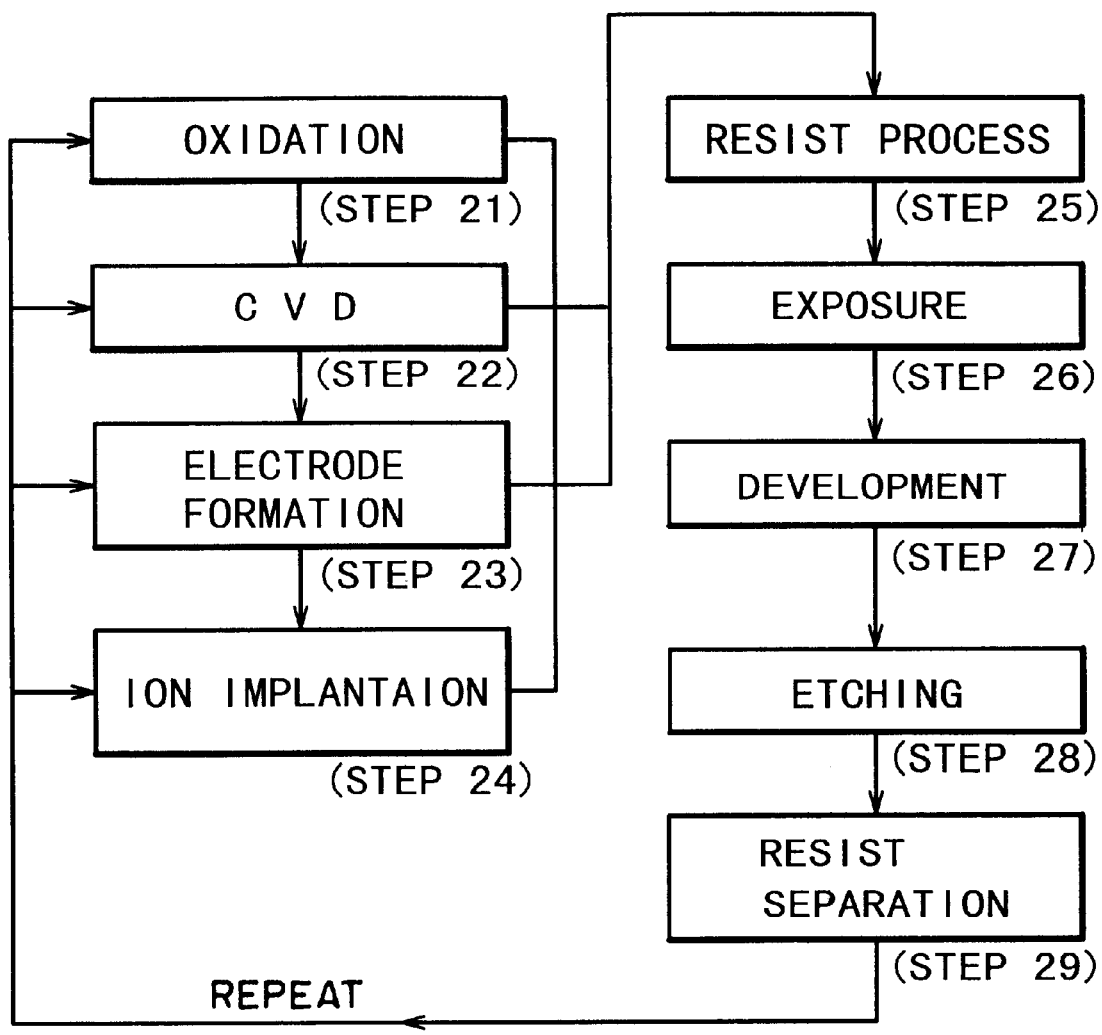
FIG. 24 is a flow chart of a wafer process.
Figure 25:
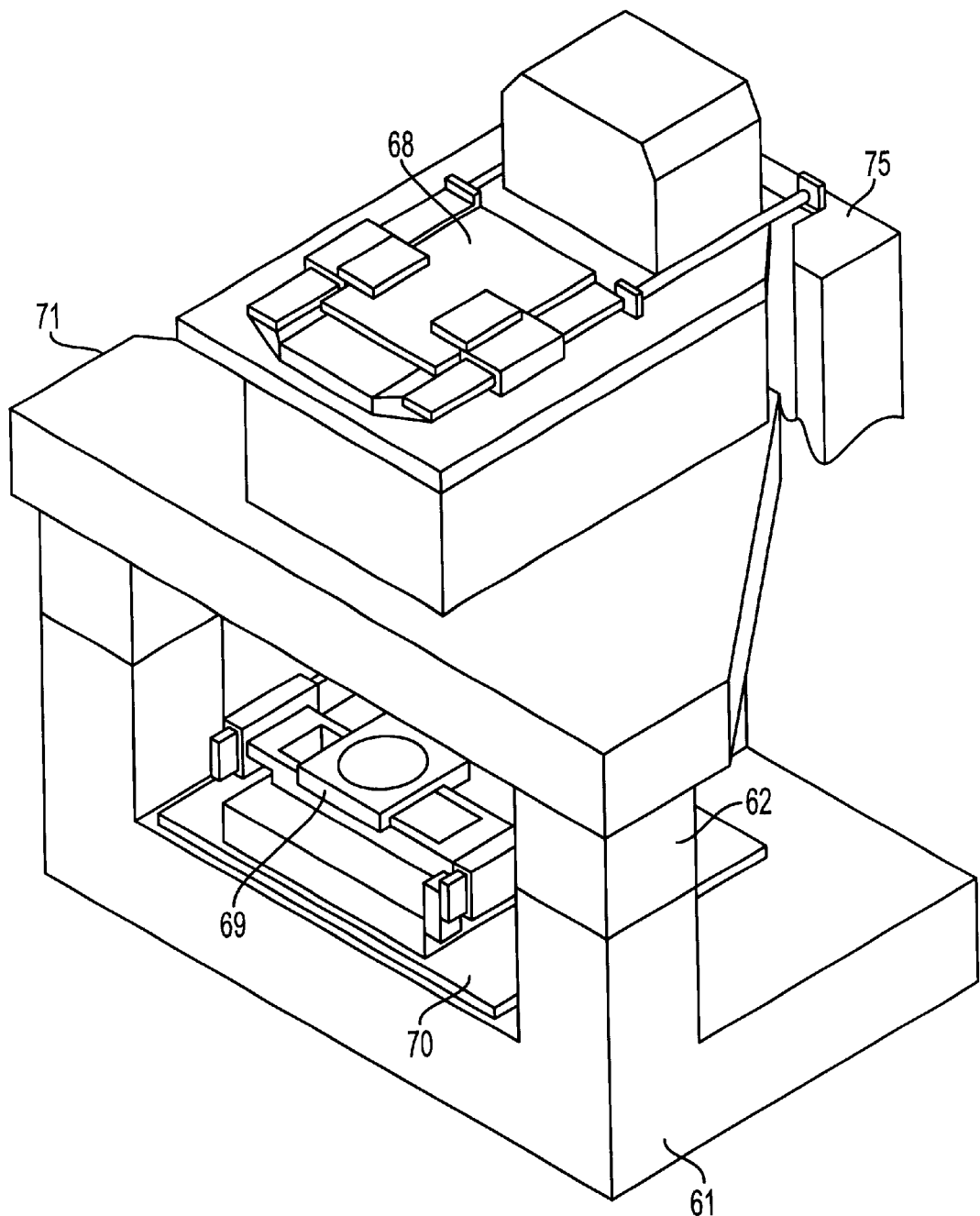
FIG. 25 is a schematic view of a conventional exposure apparatus.
Figure 26:
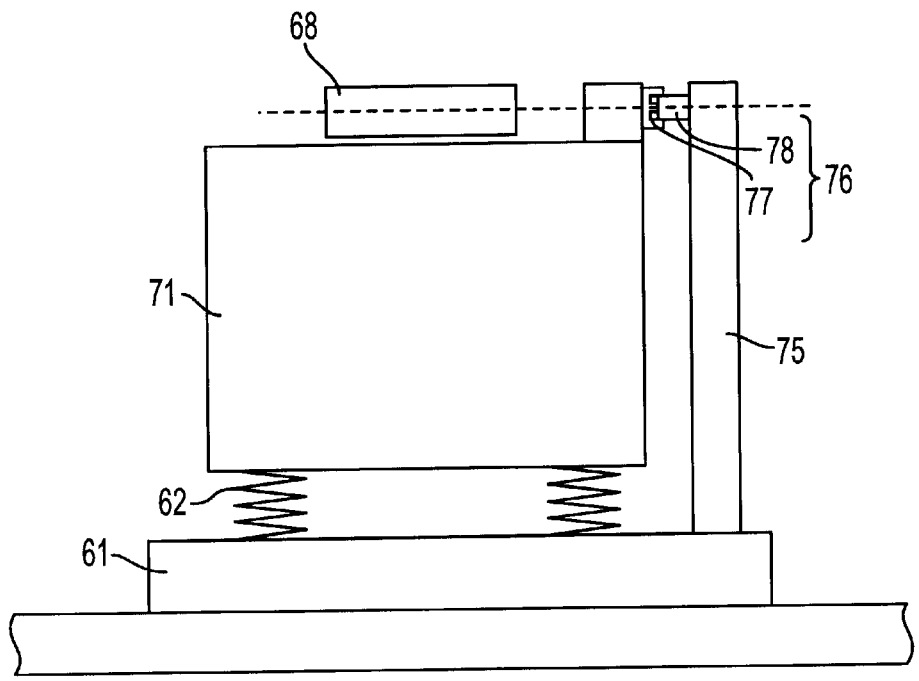
FIGS. 26 and 27 are schematic views, respectively, for explaining problems involved in a stage system.
Figure 27:
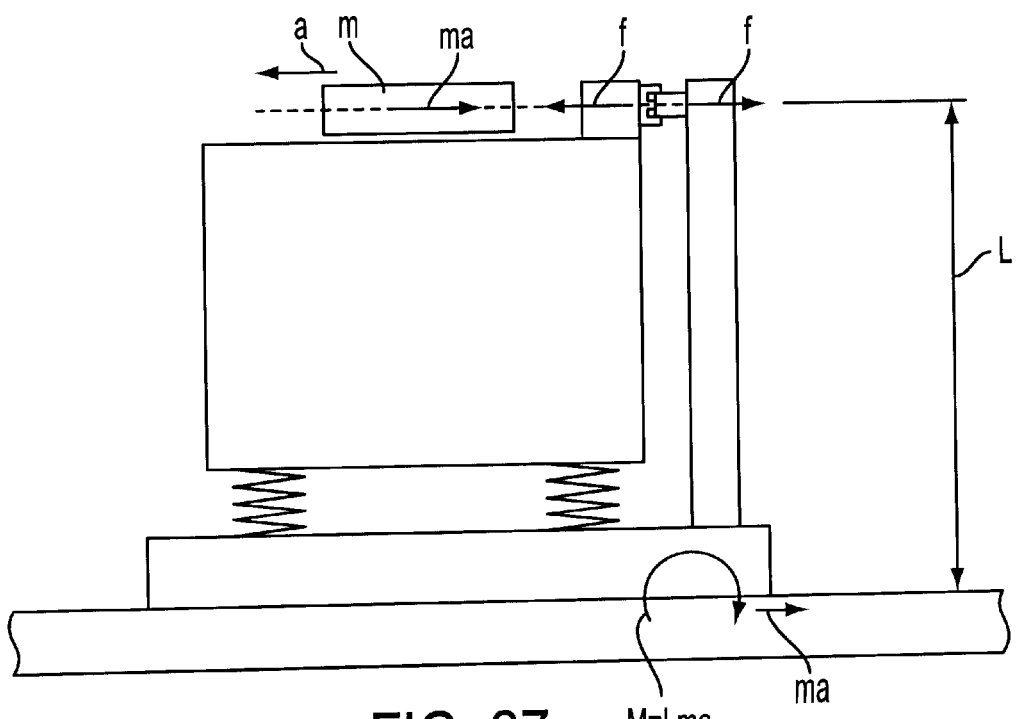

FIG. 24 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A stage system, comprising:

a stage mechanism having a movable stage and a stage supporting member for carrying said movable stage thereon;

a countermass mechanism having a movable countermass and a countermass supporting member for carrying said countermass thereon; and a connecting mechanism for transmitting a drive reactive force, produced in response to movement of said movable stage, to said countermass mechanism, said connecting mechanism comprising a thrust producing mechanism for moving said countermass, wherein said countermass supporting member is arranged separately and independently from said stage supporting member with respect to vibration.

2. A stage system according to claim 1, wherein a gravity center of said countermass is placed substantially on an extension line of a movement direction of said movable stage.

3. A stage system according to claim 1, further comprising a stage driving mechanism for moving said movable stage, and a countermass driving mechanism for moving said countermass.

4. A stage system according to claim 3, wherein said countermass driving mechanism moves said countermass to reduce a drive reactive force produced with movement of said movable stage.

5. A stage system according to claim 3, wherein at least one of said driving mechanisms comprises one of a linear motor and a ball screw.

6. A stage system according to claim 3, wherein at least a portion of said countermass driving mechanism is fixed to said countermass and is movable with said countermass.

7. A stage system according to claim 3, wherein said stage driving mechanism includes a stator supported by said stage supporting member and a movable element provided on said movable stage, and wherein one of a base for supporting said stage mechanism, said stage supporting member and said stator is connected to said countermass mechanism.

8. A stage system according to claim 7, wherein said stator is fixed to said stage supporting member.

9. A stage system according to claim 7, wherein said stator of said stage driving mechanism is supported with freedom in a direction parallel to the stage movement direction.

10. A stage system according to claim 9, wherein said stator of said stage driving mechanism is supported by use of one of a spring, a static pressure bearing and a roll bearing.

11. A stage system according to claim 3, wherein said countermass mechanism is controlled on the basis of a signal for controlling said stage mechanism.

12. A stage system according to claim 1, further comprising measuring means for measuring a position of said movable stage.

13. A stage system according to claim 12, wherein said countermass is controlled on the basis of an output of said measuring means.

14. A stage system according to claim 1, further comprising a stage driving mechanism for moving said movable stage, wherein said countermass is driven by a drive reactive force produced with movement of said movable stage.

15. A stage system according to claim 14, wherein said stage driving mechanism comprises a linear motor having a magnet and a coil, wherein and one of said magnet and said coil is provided on the stage mechanism side while the other is provided on the countermass mechanism side.

16. A stage system according to, claim 14, further comprising a moving mechanism for correcting a positional deviation of said countermass.

17. A stage system according to claim 1, wherein said stage supporting member is supported through a mounting mechanism.

18. A stage system, comprising:

a stage mechanism having a movable stage and a stage supporting member for carrying said movable stage thereon;

a countermass mechanism having a movable countermass and a countermass supporting member for carrying said countermass thereon; and a connecting mechanism for transmitting a drive reactive force, produced in response to movement of said movable stage, to said countermass mechanism, said connecting mechanism comprising a thrust producing mechanism for producing a thrust, wherein said countermass supporting member is arranged separately and independently from said stage supporting member with respect to vibration.

19. A stage system according to claim 18, wherein said connecting mechanism comprises an electromagnetic joint for producing an electromagnetic farce.

20. A stage system according to claim 19, wherein said electromagnetic joint includes a coil and a magnet for producing a thrust, wherein and one of said coil and said magnet is provided on the stage mechanism side while the other is provided on the countermass mechanism side.

21. A stage system, comprising:

a stage mechanism having a movable stage, a stage supporting member for carrying said movable stage thereon and a stage driving mechanism for generating a force between said stage and said stage supporting mechanism;

a countermass mechanism having a movable countermass, a countermass supporting member for carrying said countermass thereon and a countermass driving mechanism for generating a force between said countermass and said countermass supporting member; and a connecting mechanism for transmitting a drive reactive force, produced in response to movement of said movable stage, to said countermass mechanism, wherein said connecting mechanism includes a thrust producing mechanism for producing a thrust.

22. A stage system according to claim 21, wherein said connecting mechanism includes a rotary joint being rotatable.

23. A stage system according to claim 21, wherein said connecting mechanism comprises an electromagnetic joint for producing an electromagnetic force.

24. A stage system according to claim 23, wherein said electromagnetic joint includes a coil and a magnet for producing a thrust, wherein one of said coil and said magnet is provided on the stage mechanism side while the other is provided on the countermass mechanism side.

25. A stage system according to claim 21, further comprising a stage driving mechanism for moving said movable stage, and a countermass driving mechanism for moving said countermass.

26. A stage system according to claim 25, wherein said countermass driving mechanism moves said countermass to reduce a drive reactive force produced with movement of said movable stage.

27. A stage system according to claim 25, wherein said countermass driving mechanism includes one of a linear motor and a ball screw.

28. A stage system according to claim 21, further comprising a stage driving mechanism for moving said movable stage, wherein said countermass is driven by a reactive force produced with movement of said movable stage.

29. A stage system according to claim 28, wherein said stage driving mechanism comprises a linear motor having a magnet and a coil, and one of said magnet and said coil is provided on the stage mechanism side while the other is provided on the countermass mechanism side.

30. A stage system according to claim 21, further comprising a moving mechanism for correcting a positional deviation of said countermass.

31. A stage system according to claim 21, wherein a gravity center of said countermass is placed substantially on an extension line of a movement direction of said movable stage.

32. A stage system according to claim 21, wherein said stage supporting member is supported through a mounting mechanism.

33. An exposure apparatus, comprising:

an illumination optical system for providing illumination light; and a stage system for carrying one of a reticle and a wafer thereon, said stage system including (i) a stage mechanism having a movable stage, a stage supporting member for carrying said movable stage thereon and a stage driving mechanism for generating a force between said movable stage and said stage supporting mechanism, (ii) a countermass mechanism having a movable countermass, a countermass supporting member for carrying said countermass thereon and a countermass driving mechanism for generating a force between said countermass and said countermass supporting member, and (iii) a connecting mechanism for transmitting a drive reactive force, produced in response to movement of said movable stage, to said countermass, said connecting mechanism comprising a thrust producing mechanism for moving said countermass.

34. An exposure apparatus, comprising:

an illumination optical system for providing illumination light; and a stage system for carrying one of a reticle and a wafer thereon, said stage system including (i) a stage mechanism having a movable stage, a stage supporting member for carrying said movable stage thereon and a stage driving mechanism for generating a force between said movable stage and said stage supporting mechanism, (ii) a countermass mechanism having a movable countermass, a countermass supporting member for carrying said countermass thereon and a countermass driving mechanism for generating a force between said countermass and said countermass supporting member, and (iii) a connecting mechanism for transmitting a drive reactive force, produced in response to movement of said movable stage, to said countermass mechanism, wherein said connecting mechanism includes a thrust producing mechanism for producing a thrust.

35. A device manufacturing method, comprising the steps of:

providing an exposure apparatus with a stage system which includes (i) a stage mechanism having a movable stage, a stage supporting member for carrying the movable stage thereon and a stage driving mechanism for generating a force between the stage and the stage supporting mechanism, (ii) a countermass mechanism having a movable countermass, a countermass supporting member for carrying the countermass thereon and a countermass driving mechanism for generating a force between the countermass and the countermass supporting member and (iii) a connecting mechanism for transmitting a drive reactive force, produced in response to movement of the movable stage, to the countermass, the connecting mechanism comprising a thrust producing mechanism for moving the countermass; and transferring a pattern of a reticle onto a wafer by use of the exposure apparatus.

36. A method according to claim 35, further comprising applying a photosensitive material onto the wafer, and developing the wafer after being sensitized.

37. A device manufacturing method, comprising the steps of:

providing an exposure apparatus with a stage system which includes (i) a stage mechanism having a movable stage, a stage supporting member for carrying the movable stage thereon and a stage driving mechanism for generating a force between the stage and the stage supporting member, (ii) a countermass mechanism having a movable countermass, a countermass supporting member for carrying the countermass thereon and a countermass driving mechanism for generating a force between the countermass and the countermass supporting member, and (iii) a connecting mechanism for transmitting a drive reactive force, produced in response to movement of the movable stage, to the countermass mechanism, wherein the connecting mechanism includes a thrust producing mechanism for moving the countermass; and transferring a pattern of a reticle onto a wafer by use of the exposure apparatus.

38. A method according to claim 37, further comprising applying a photosensitive material onto the wafer, and developing the wafer after being sensitized.

39. A stage system, comprising:

a stage mechanism having a movable stage and a stage supporting member for carrying said movable stage thereon;

a countermass mechanism having a movable countermass and a countermass supporting member for carrying said countermass thereon;

a connecting mechanism for transmitting a drive reactive force, produced in response to movement of said movable stage, to said countermass, said connecting mechanism comprising a thrust producing mechanism for moving said countermass;

a stage driving mechanism for moving said movable stage; and a countermass driving mechanism for moving said countermass, wherein said stage supporting member and said countermass supporting member are arranged for vibration isolation.

40. A stage system according to claim 39, wherein said countermass driving mechanism moves said countermass to reduce a drive reactive force produced with movement of said movable stage.

41. A stage system according to claim 39, wherein at least one of said driving mechanisms comprises one of a linear motor and a ball screw.

42. A stage system according to claim 39, wherein at least a portion of said countermass driving mechanism is fixed to said countermass and is movable with said countermass.

43. A stage system according to claim 39, wherein said stage driving mechanism includes a stator supported by said stage supporting member and a movable element provided on said movable stage, and wherein one of a base for supporting said stage mechanism, said stage supporting member and said stator is connected to said countermass mechanism.

44. A stage system according to claim 43, wherein said stator is fixed to said stage supporting member.

45. A stage system according to claim 43, wherein said stator of said stage driving mechanism is supported with freedom in a direction parallel to the stage movement direction.

46. A stage system according to claim 45, wherein said stator of said stage driving mechanism is supported by use of one of a spring, a static pressure bearing and a roll bearing.

47. A stage system according to claim 39, wherein said countermass mechanism is controlled on the basis of a signal for controlling said stage mechanism.

48. A stage system, comprising:
   a stage mechanism having a movable stage and a stage supporting member for carrying said movable stage thereon;
   a countermass mechanism having a movable countermass and a countermass supporting member for carrying said countermass thereon; and
   a connecting mechanism for transmitting a drive reactive force, produced in response to movement of said movable stage, to said countermass mechanism, said connecting mechanism comprising a thrust producing mechanism for producing a thrust and an electromagnetic joint for producing an electromagnetic force,
   wherein said stage supporting member and said countermass supporting member are arranged for vibration isolation.

49. A stage system according to claim 48, wherein said electromagnetic joint includes a coil and a magnet for producing a thrust, and one of said coil and said magnet is provided on the stage mechanism side while the other is provided on the countermass mechanism side.

* * * * *

UNITED STATES PATENT AND TRADEMARK OFFICE
CERTIFICATE OF CORRECTION

PATENT NO. : 6,396,566 B2
DATED : May 28, 2002
INVENTOR(S) : Ryuichi Ebinuma et al.

It is certified that error appears in the above-identified patent and that said Letters Patent is hereby corrected as shown below:

Drawings,
Sheet 21, Fig. 24, "IMPLANTAION" should read -- IMPLANTATION --.

Column 7,
Line 30, "by" should read -- separately --.
Line 31, "a separate" should be deleted.

Column 8,
Line 4, "force;" should read -- force, --.
Line 24, "passe" should read -- pass --.

Column 9,
Line 17, "reduced" should read -- reduced. -- and "electro motive" should read -- electromotive --.
Line 19, "disturbance" should read -- disturbances --.

Column 13,
Line 39, "misaligned" should read -- misalignment --.

Column 14,
Line 26, "Thbrefore," should read -- Therefore, --.
Line 27, "forced" should read -- force --.

Column 17,
Line 54, "wherein" should be deleted.

Column 18,
Line 45, "wherein" should read -- and --.

Signed and Sealed this

Fifth Day of November, 2002

Attest:

JAMES E. ROGAN
Attesting Officer          Director of the United States Patent and Trademark Office